(12) United States Patent
Shima

(10) Patent No.: US 7,924,398 B2
(45) Date of Patent: Apr. 12, 2011

(54) OPTICAL APPARATUS AND METHOD OF MANUFACTURING DEVICE

(75) Inventor: Shinichi Shima, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 204 days.

(21) Appl. No.: 11/365,292

(22) Filed: Feb. 28, 2006

(65) Prior Publication Data
US 2006/0197932 A1    Sep. 7, 2006

(30) Foreign Application Priority Data
Mar. 4, 2005 (JP) .................... 2005-060651

(51) Int. Cl.
G03B 27/52 (2006.01)
G03B 27/62 (2006.01)
(52) U.S. Cl. .......................... 355/30; 355/75
(58) Field of Classification Search ............ 355/30, 355/53, 67, 72, 75; 359/819, 820
See application file for complete search history.

(56) References Cited

U.S. PATENT DOCUMENTS

| | | | | |
|---|---|---|---|---|
| 4,724,466 A * | 2/1988 | Ogawa et al. | ..................... | 355/53 |
| 5,907,390 A * | 5/1999 | Sakamoto | ...................... | 355/30 |
| 6,288,769 B1 * | 9/2001 | Akagawa et al. | ............... | 355/30 |
| 6,542,220 B1 * | 4/2003 | Schrijver et al. | ................ | 355/53 |
| 6,665,046 B2 * | 12/2003 | Nogawa et al. | ................. | 355/30 |
| 6,721,031 B2 * | 4/2004 | Hasegawa et al. | .............. | 355/30 |
| 6,747,729 B2 * | 6/2004 | Pril et al. | ......................... | 355/30 |
| 6,762,412 B1 | 7/2004 | Akagawa | | |
| 6,833,903 B2 * | 12/2004 | Kamono | ......................... | 355/30 |
| 7,145,641 B2 * | 12/2006 | Kroon et al. | .................... | 355/71 |
| 2001/0015795 A1 * | 8/2001 | Nishi | ............................... | 355/53 |
| 2002/0000519 A1 * | 1/2002 | Tsukamoto | ................ | 250/492.1 |
| 2002/0018190 A1 | 2/2002 | Nogawa et al. | | |
| 2002/0112784 A1 * | 8/2002 | Tanaka et al. | ................. | 148/213 |
| 2002/0191163 A1 | 12/2002 | Hasegawa et al. | | |
| 2003/0133087 A1 * | 7/2003 | Shima | ........................... | 355/53 |
| 2003/0169407 A1 * | 9/2003 | Hasegawa et al. | .............. | 355/30 |
| 2004/0174509 A1 * | 9/2004 | Jansen et al. | .................... | 355/53 |
| 2005/0030496 A1 * | 2/2005 | Chibana et al. | ................ | 355/30 |

FOREIGN PATENT DOCUMENTS

| | | |
|---|---|---|
| EP | 1229573 A1 | 8/2002 |
| EP | 1326139 A2 | 7/2003 |
| EP | 1600818 A1 | 11/2005 |
| EP | 1650603 A1 | 4/2006 |
| JP | 09022870 A * | 1/1997 |
| JP | 2001-028331 A | 1/2001 |

* cited by examiner

Primary Examiner — Hung Henry Nguyen
Assistant Examiner — Steven H Whitesell-Gordon
(74) Attorney, Agent, or Firm — Canon U.S.A., Inc. I.P. Division

(57) ABSTRACT

An optical apparatus including an optical element includes a holder configured to hold the optical element, and a rectifier configured to rectify a flow of gas in a space adjacent to a surface of the optical element, and to decrease the flow rate of the gas adjacent to the surface of the optical element.

2 Claims, 21 Drawing Sheets

OPTICAL APPARATUS AND METHOD OF MANUFACTURING DEVICE

BACKGROUND OF THE INVENTION

1. Field of the Invention

The present invention relates to an optical apparatus such as an exposure apparatus that is suitable for use in the production of a device such as a semiconductor device, and a method of manufacturing a device using the exposure apparatus.

2. Description of the Related Art

Various processes are performed on a substrate (e.g. a semiconductor wafer substrate or a glass substrate) in the production process of semiconductor devices such as ICs, LSIs, and liquid crystal panels. Among these processes, the exposure process for printing a pattern is an essential process in semiconductor manufacturing. Exposure apparatuses (such as a stepper or a scanner) are known for performing this process.

Resists applied to a wafer are broadly divided into a polymer film that is efficiently subjected to a chemical reaction by an ionization radiation (such as ultraviolet rays, X rays, or an electron beam) and a chemical amplification resist in which a catalyst (an acid) is produced by exposure and an image is formed by the catalyst in post-exposure baking (PEB). The sensitively of such a chemical amplification resist can be easily improved because the image is formed using the catalyst. Therefore, recently, chemical amplification resists are generally used as a resist for excimer laser beams, by which it is difficult to provide a satisfactory illuminance.

On the other hand, in the chemical amplification resist, the catalyst generated by exposure diffuses in air and on the surface of the wafer and the catalytic action is accelerated by the post-exposure baking (PEB), thereby degrading the image profile. Accordingly, in use of the chemical amplification resist, the control of chemical pollution due to a basic gas such as an amine or an amide is required in the environmental atmosphere during the steps of resist application, exposure, and post-exposure baking (PEB).

An exposure apparatus includes various optical members such as lenses and mirrors, in addition to an illumination optical system that irradiates light emitted from a light source on the surface of a reticle (original plate). As the exposure wavelength decreases, the optical members that transmit the exposure light and that are irradiated with the exposure light become clouded, resulting in a decrease in the light exposure reaching the surface of the wafer. The substances that cause the clouding are organic compounds and ammonium sulfate $((NH_4)_2SO_4)$. The possible cause is that ammonium ion $(NH_4^+)$, sulfate ion $(SO_4^{2-})$, a compound thereof, or an organic gas that is contained in air is subjected to a photochemical reaction by irradiation of the exposure light, and the resulting product adheres to the optical members.

Hitherto, in order to overcome problems that the surface of the chemical amplification resist becomes insoluble and the optical members become clouded, an impurity-removing filter is installed in an environmental chamber that controls the temperature, the humidity, and dust in the environment surrounding the main body of the exposure apparatus to remove substances such as a basic gas, a sulfuric acid gas, and an organic compound gas in the atmosphere.

As additional countermeasures, components used in the environmental chamber are subjected to treatments such as washing, and a lubricant or the like that generates a small amount of outgassing of the above components is selected for use. Also, a part of or all of the space surrounding the optical path from a light source to a substrate to be processed is purged with a gas inert to the exposure light.

Japanese Patent Laid-Open No. 2001-028331 discloses an example of purging with an inert gas. The invention described in this patent document focuses on a method of supplying a gas for purging when a casing of an optical apparatus is purged with an inert gas, i.e., nitrogen, and aims to reduce the contamination of optical members such as lenses due to the gas to be supplied.

When the gas supplied from a gas supply unit at a predetermined flow rate is introduced in the casing, the flow rate of the gas is decreased relative to the predetermined flow rate. Consequently, when the gas reaches the surfaces of the optical members, the flow rate of the gas is decreased and the gas is easily dispersed, and thus impurities contained in the gas are not easily adhered to the optical members.

Furthermore, a space from a light source to a leading end of a projection optical system has a hermetically sealed structure to separate from the outside air. This structure prevents impurities from adhering to the surface of an optical member of the optical apparatus, the surface not being in contact with the outside air.

According to the invention described in the patent document, a space from the light source to the leading end of the projection optical system or to a wafer stage space has a hermetically sealed structure to separate it from the outside air, thereby preventing impurities from adhering on the optical members.

However, when the space from the light source to the leading end of the projection optical system or to the wafer stage space has a hermetically sealed structure, the apparatus is increased in size, and an opening and closing mechanism is essentially provided at positions for carrying in and out a mask (original plate) and a wafer (substrate). Therefore, in order to maintain the purging performance, the operation ratio of the apparatus is disadvantageously decreased.

In addition, since almost all parts of the apparatus are purged, a large amount of inert gas is required, resulting in an increase in the operating cost of the apparatus.

In the invention described in the above patent document, impurities contained in the gas for purging are not easily and intensively adhered on the surfaces of the optical members in the hermetically sealed casing, thus achieving the main purpose of the invention. However, when the impurities or a space containing the impurities is irradiated with exposure light to generate a substance that adhere on the surfaces of the optical members by a photochemical reaction, the above invention does not provide an effect of suppressing the amount of the substance that adhere as long as the concentration of the impurities is constant and the supply flow volume of the purge gas is constant. Therefore, the clouding of the surfaces of the optical members cannot be prevented.

Furthermore, although the intensive adhesion may be prevented, the impurities may be adhered on the other parts. When the impurities are partially and intensively adhered, it is effective that such a part is disposed away from the area used for the optical system. On the other hand, in the structure described in the patent document, the possibility of adhesion of the impurities is generated in all the optical members provided on the purging pathway. As a result, the transmittance of the optical members is disadvantageously decreased.

In order to prevent the size of the apparatus from increasing, the optical apparatus has a hermetically sealed structure and the inside thereof is purged, and the clouding of the optical members of the optical apparatus being in contact with the outside air is prevented with an impurity-removing filter provided in the environmental chamber. Although this structure is realistic, even when the impurity-removing filter is provided in the environmental chamber, the impurities cannot be completely removed.

In addition, such an impurity-removing filter has a lifetime for maintaining the removing performance depending on the amount of impurities removed, resulting in problems of maintenance and operating cost of the filter.

SUMMARY OF THE INVENTION

The present invention has been made in view of the above background, and provides a novel technique for reducing contamination of the surface of an optical element.

According to an aspect of the present invention, an optical apparatus including an optical element includes a holder configured to hold the optical element, and a rectifier configured to rectify a flow of gas in a space adjacent to a surface of the optical element and to decrease a flow rate of the gas adjacent to the surface of the optical element.

According to another aspect of the present invention, the apparatus is an exposure apparatus for exposing a substrate to light via an original plate in a chamber in which a gas flow is generated by an atmosphere conditioner.

According to another aspect of the present invention, a method of manufacturing a device includes steps of exposing a substrate to light using the above exposure apparatus, developing the exposed substrate, and processing the developed substrate to manufacture the device.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such an example, however, is not exhaustive of the various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

First Embodiment

A first embodiment of the present invention will now be described with reference to FIGS. 1 to 6.

Figure 1:
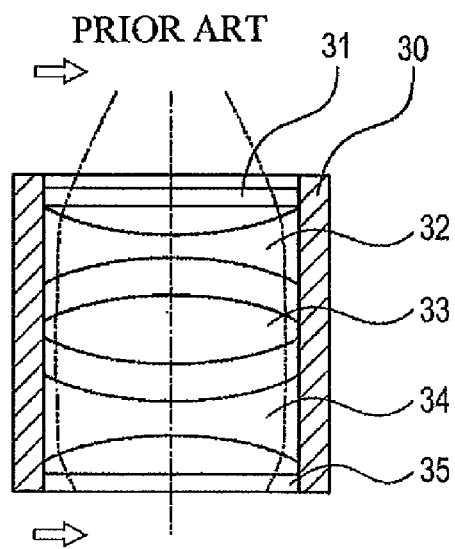
FIG. 1 is a view of a known optical apparatus.
Figure 2:
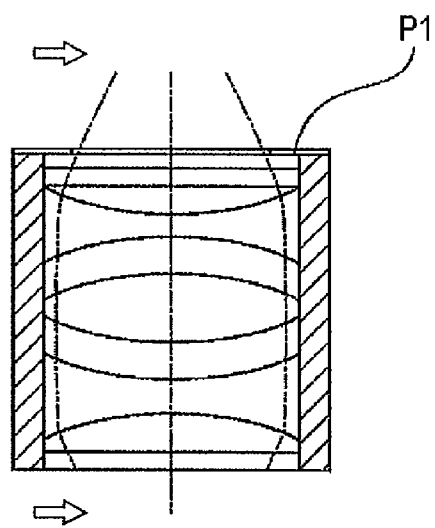
FIG. 2 is a view of a first embodiment of the present invention.
Figure 3:
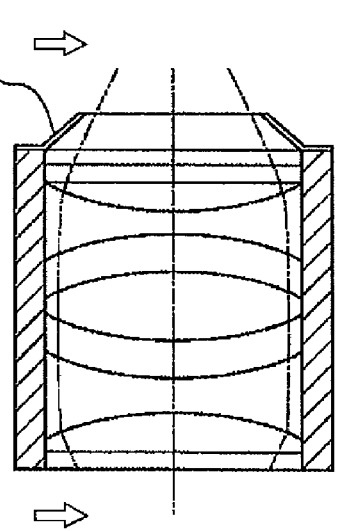
FIG. 3 is a view of the first embodiment of the present invention.

FIG. 1 shows a known optical apparatus and FIGS. 2 and 3 show optical apparatuses to which the present invention is applied. In FIGS. 1 to 3, the same reference numerals indicate the same components and overlapping descriptions are omitted. Optical elements 31 to 35 are disposed in a casing 30 and the optical elements 31 and 35 are in contact with the outside air. The casing 30 has a hermetically sealed structure. The casing 30 includes a supply port and a discharge port (not shown in the figures) for a purge gas, and the inside of the casing 30 is replaced with a gas (an inert gas such as nitrogen or argon) for purging contaminants. An airflow including natural convection is present outside of the casing 30. The hollow arrows in the figures indicate the direction of the airflow. The broken lines indicate an illumination path that transmits through the optical elements or a light flux for detection.

FIGS. 2 and 3 are different from FIG. 1 in that a rectifying plate P1 or P2 is provided.

Figure 4:
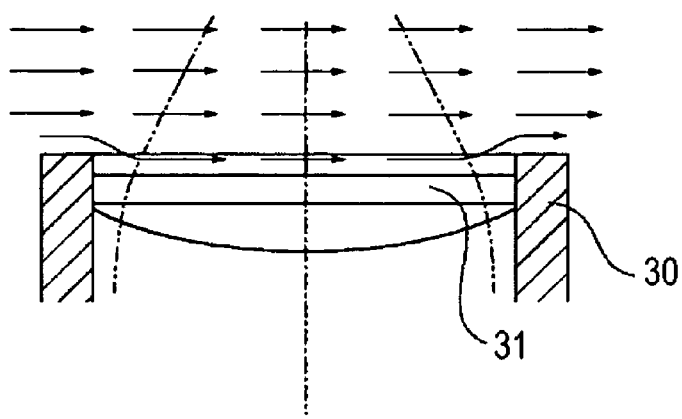
FIG. 4 is an enlarged view of the known optical apparatus.

The operation will be described. FIG. 4 is an enlarged view including the optical element 31 in FIG. 1.

In an optical apparatus, the outermost optical element is generally disposed at a position slightly inside the casing. In FIG. 4, the optical element 31 is disposed at a position slightly inside the outer surface of the casing 30. This structure is based on a consideration from the viewpoint of design. In other words, when the optical apparatus is assembled or transported, for example, when the optical apparatus is placed on a table, this structure prevents the optical element from being damaged. For this purpose, it is sufficient that the optical element 31 is disposed at a position even slightly inside the outermost surface of the casing 30. In such a structure, when an airflow is present in the outside air surrounding the casing 30, as shown in FIG. 4, an airflow shown by the arrows in the figure is present on the surface of the optical element 31, the surface being in contact with the outside air.

Figure 5:
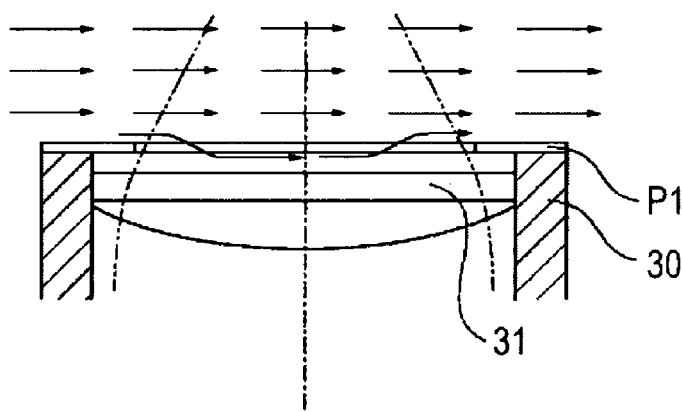
FIG. 5 is an enlarged view of the first embodiment of the present invention.

FIG. 5 is an enlarged view including the optical element 31 in FIG. 2. As compared with the optical apparatus in FIG. 4, the optical apparatus in FIG. 5 includes the rectifying plate P1 provided on the outermost part of the casing 30. This structure decreases the area of the airflow on the surface of the optical element 31, the surface being in contact with the outside air, and decreases the flow rate of the airflow.

Figure 6:
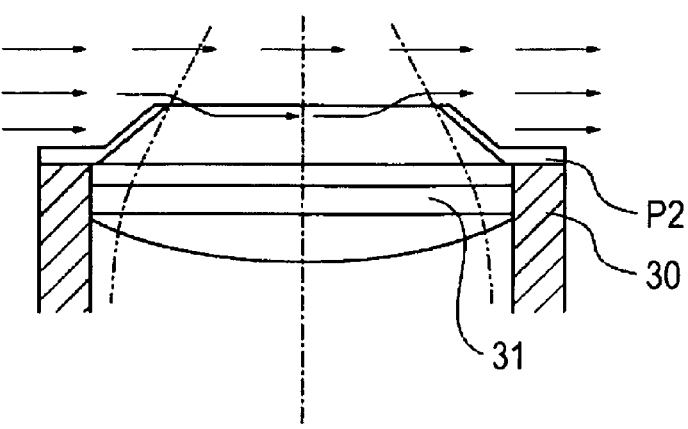
FIG. 6 is an enlarged view of the first embodiment of the present invention.

FIG. 6 is an enlarged view including the optical element 31 in FIG. 3. As compared with the optical apparatus in FIG. 4, the optical apparatus in FIG. 6 includes the rectifying plate P2 provided on the outermost part of the casing 30. This structure further decreases the area of the airflow on the surface of the optical element 31, the surface being in contact with the outside air, and further decreases the flow rate of the airflow as compared with those in FIG. 5.

As a result of intensive studies made by the present inventors, the following relationship between the flow rate of an airflow and the clouding has been found: When the concentration of impurities in a purge gas is constant, it is effective to decrease the flow volume at the periphery of an optical element, in other words, to decrease the total amount of impurities passing over the surface of the optical element.

Accordingly, when the concentration of impurities in the environment where an optical apparatus is placed is substantially constant, in order to suppress the clouding on the surface of an optical element of the optical apparatus, the surface being in contact with the outside air, it is effective to decrease the flow rate of an airflow on the surface of the optical element of the optical apparatus, the surface being in contact with the outside air. The decrease in the flow rate of the airflow decreases the flow volume passing over the surface of the optical element, thereby decreasing the total amount of impurities passing over the surface of the optical element. Consequently, contamination on the surface of the optical element can be suppressed.

In order to decrease the flow rate of an airflow, it is effective that a rectifying plate for adjusting the flow of the airflow on the surface of the optical element of the optical apparatus, the surface being in contact with the outside air, is provided so as to form a stagnant portion in the vicinity of the surface of the optical element. Thereby, the flow rate is decreased or the airflow stagnates.

In the known art disclosed in Japanese Patent Laid-Open No. 2001-028331, when the concentration of impurities in a purge gas is constant and the supply flow volume of the purge gas is also constant, the purge gas is blown on a local part of an optical member in the casing. The adhesion of the impurities in the purge gas on the local part is prevented by decreasing the inflow rate of the purge gas. Accordingly, this technology only suppresses the local contamination on the surface of the optical member disposed in the vicinity of the inlet of the purge gas in the casing. The present embodiment is fundamentally different from the above technology. In this embodiment, by allowing the airflow on the surface of the optical element to stagnate, the flow rate of the airflow is decreased, the flow volume is decreased, and the total amount of impurities passing over the surface of the optical element is decreased. The rectifying plate P1 or P2 is provided for this purpose. In this embodiment, substances that adhere on the optical element and result in the clouding are generated by a photochemical reaction caused by irradiation of exposure light, and impurities that generate the reaction product are focused on. In contrast, the above known technology focuses on the phenomenon that impurities in the purge gas are directly adhered on the surface of the optical element. Thus, the present embodiment is significantly different from the known technology. Consequently, in the present embodiment, the gas flow rate is decreased in a wide range, i.e., in the entire area through which light passes (also referred to as "effective area"), the area being disposed on the surface of the optical element.

As shown in FIGS. 5 and 6, in the present embodiment, since the rectifying plate P1 or P2 is provided, the flow rate of the airflow on the surface of the optical element 31 can be decreased to suppress the clouding of the optical element 31. The optical element 31 has been described here, but the present embodiment may be applied to the optical element 35 disposed on the opposite face. In such a case, the same advantage as that described in the optical element 31 can be achieved.

Aluminum, a stainless steel, or the like may be used as the material of the rectifying plate P1 or P2, and the rectifying plate P1 or P2 can be sufficiently cleaned by washing without performing any surface treatment. For example, the rectifying plate P1 or P2 having a cleanliness of about 0.05 $\mu g/m^3$, which is up to the detection limit in an organic substance degassing measurement by means of gas chromatography, can be used. Also, when a surface treatment is performed or a porous material such as a ceramic is used, the rectifying plate P1 or P2 having the equivalent cleanliness may be used.

Second Embodiment

A second embodiment will now be described with reference to FIGS. 7 to 9. The difference from the first embodiment is that the second embodiment focuses on the position of an optical element of an optical apparatus, the optical element being in contact with the outside air.

Figure 7:
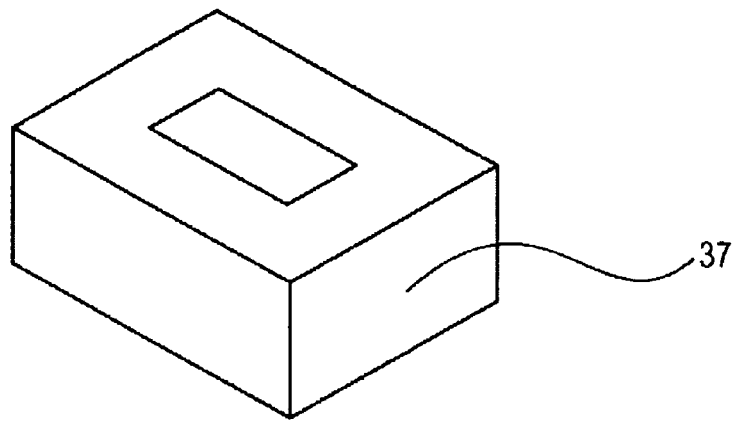
FIG. 7 is a view of the known optical apparatus.

FIG. 7 is a perspective view of an optical element part that is in contact with the outside air surrounding an optical apparatus. FIG. 8 shows a cross-sectional view of FIG. 7 for explanation. A lens-barrel 38 is disposed in a casing 37 and optical elements 33 to 36 are disposed inside the lens-barrel 38. The lens-barrel 38 is not important in view of the description. A plurality of lens-barrels 38 may be provided and the lens-barrel 38 may include a driving system and the like. The optical apparatus is not particularly limited as long as an optical system is disposed in the casing 37. An optical element 31 has a width of dimension R in the direction orthogonal to the airflow of the outside air (refer to FIG. 9). Since the width in FIG. 9 is shown by a cross-sectional view, the optical element 31 has a total width of 2 R in reality. As described in the first embodiment, the optical element 31 is generally disposed at a position slightly inside the outermost surface of the casing 37. However, in FIG. 8, the optical element 31 is shown at a position substantially the same position as the outermost surface for the sake of description. On the other hand, the optical element 31 shown in FIG. 9 is disposed at a position away from the outermost surface of the casing 37 by D.

As the surface of the optical element 31 being in contact with the outside air is away from the outermost surface of the casing 37, the effect of the airflow of the outside air decreases. In a design considering a general transportation or a general assembly, it is sufficient that the optical element 31 does not protrude from the outermost surface of the casing 37.

Figure 8:
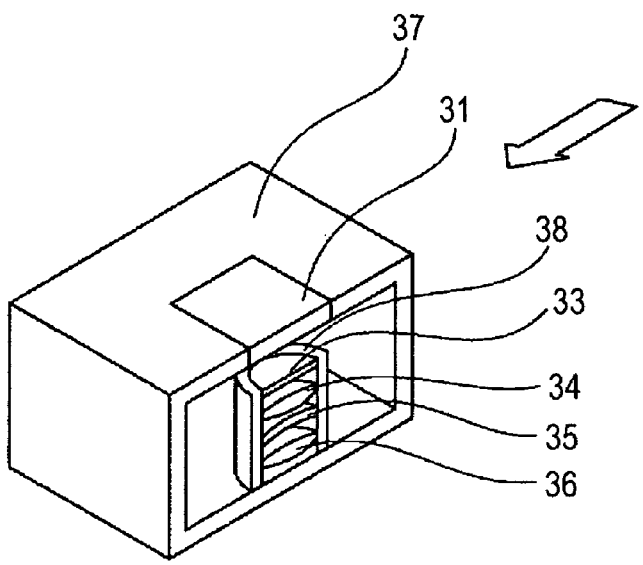
FIG. 8 is a cross-sectional view of FIG. 7.
Figure 9:
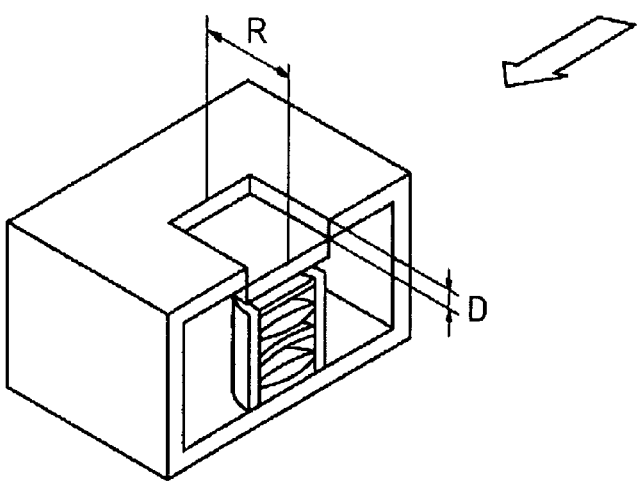
FIG. 9 is a view of a second embodiment of the present invention.

In FIG. 9, the optical element 31 is disposed at a position away from the outermost surface of the casing 37 such that the flow rate on the surface of the optical element 31 in FIG. 9 is ½ or less of the flow rate of the airflow on the surface of the optical element 31 in FIG. 8, the surface being in contact with the outside air. The optical apparatus is generally used in an environment including a temperature-controlled air flow through a ULPA filter, an impurity-removing filter, or the like that reduces dust in the entire environment where the optical apparatus is located. Therefore, by decreasing the flow rate to ½ or less and decreasing the amount of clouding to ½, satisfactory effect can be achieved. The clouding cannot be completely suppressed, but when the optical member is periodically replaced with a new one to maintain the illuminance during exposure, the frequency of the replacement can be decreased to ½. For example, an optical member replacement of every three months in the past is only required to be replaced every six months in the present embodiment. This countermeasure is effective in that the operation ratio of the apparatus is improved and the operating cost can be reduced. If the flow rate can be decreased to zero, this is the most preferable form. As described above, by disposing the optical element 31 at a position away from the outermost surface of the casing 37, the total amount of impurities passing over the surface of the optical element 31, the surface being in contact with the outside air, can be decreased to suppress the clouding as in the first embodiment.

Third Embodiment

A third embodiment will now be described with reference to FIGS. 7 to 9 and FIGS. 10 to 16.

The third embodiment is different from the second embodiment in that the relationship between the dimension D and dimension R is specified in FIG. 9.

Figure 10:
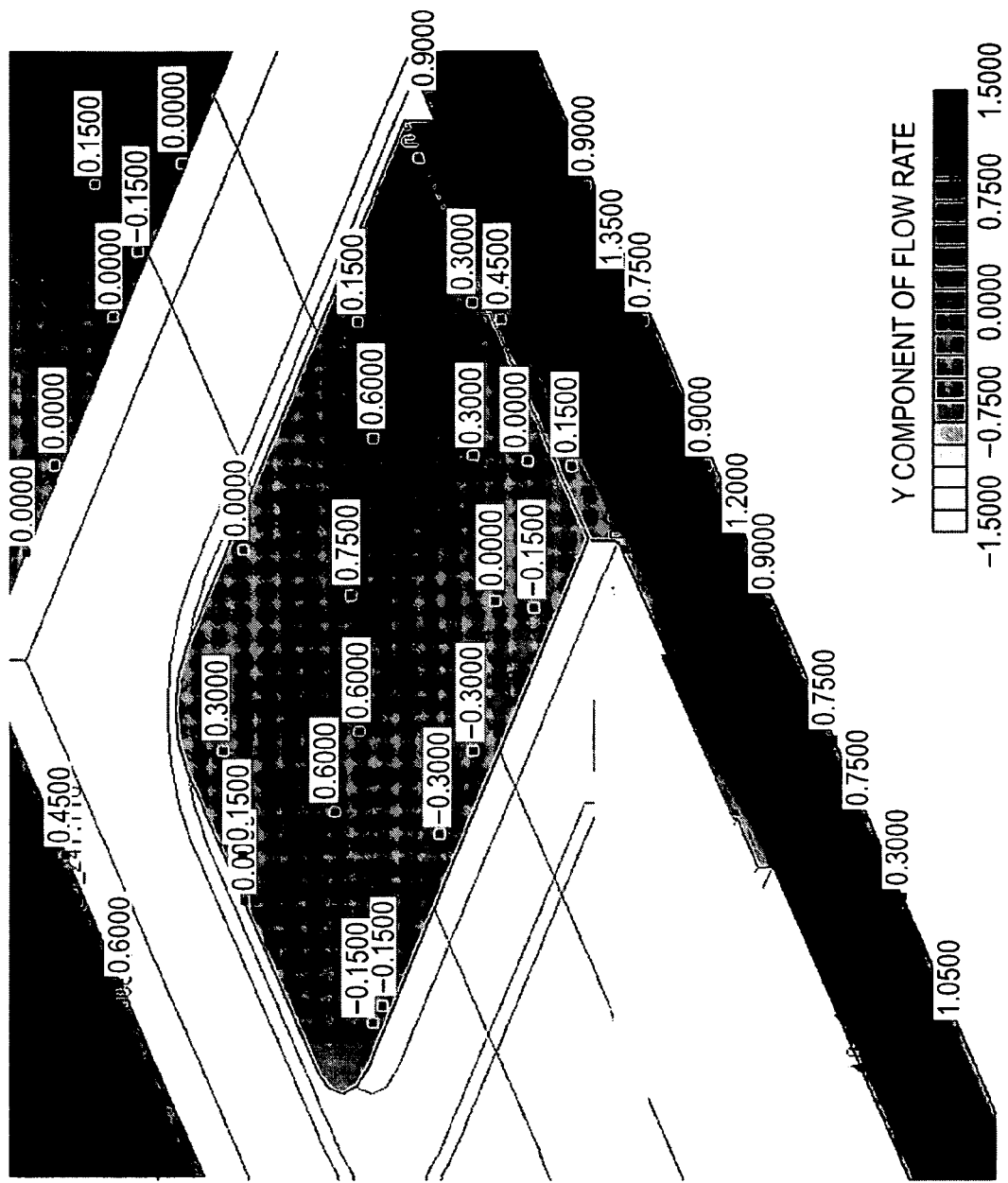
FIG. 10 shows a result of an airflow analysis of the known optical apparatus.
Figure 11:
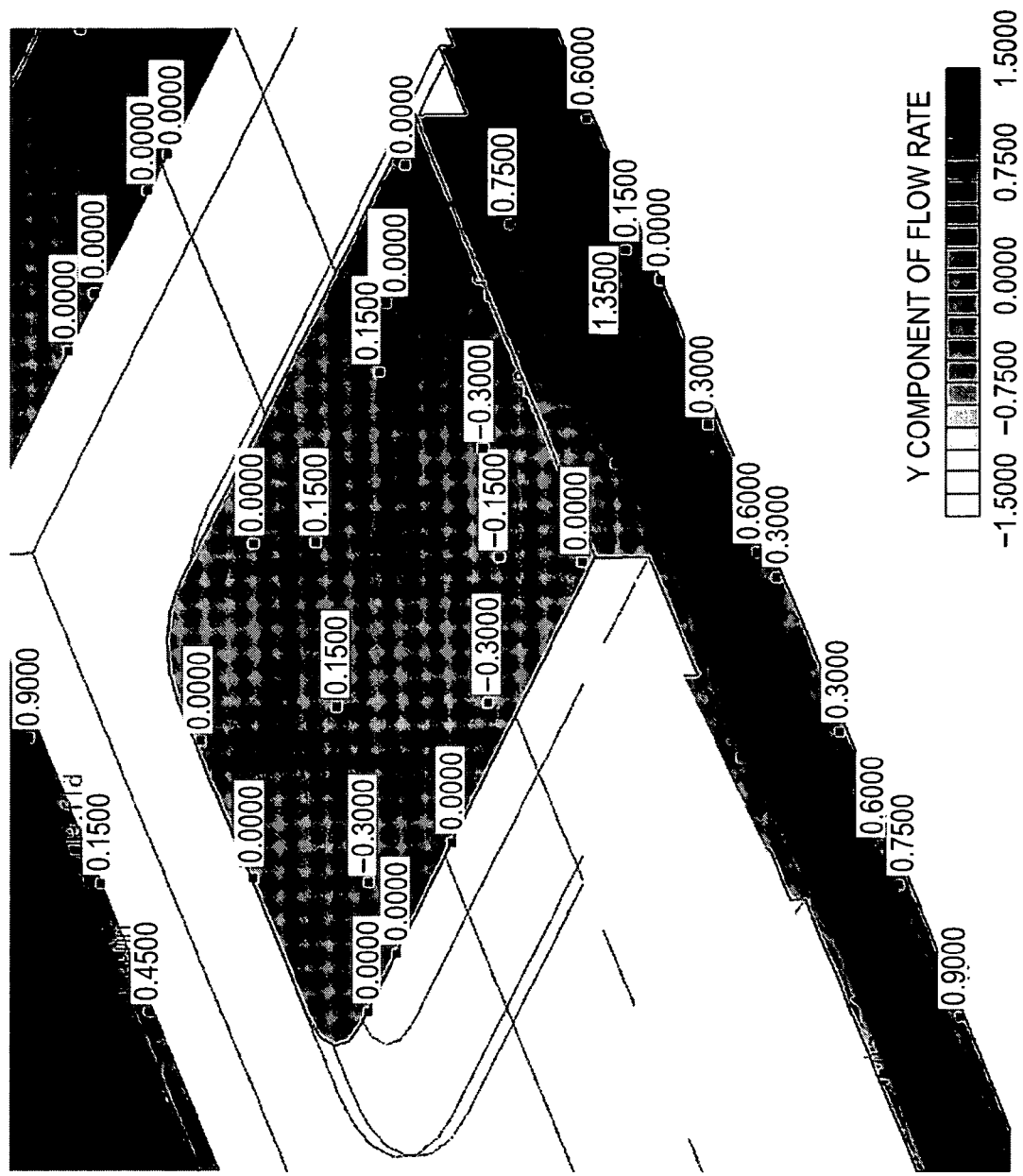
FIG. 11 shows a result of an airflow analysis when the dimension D in FIG. 9 is 2.5 mm.
Figure 12:
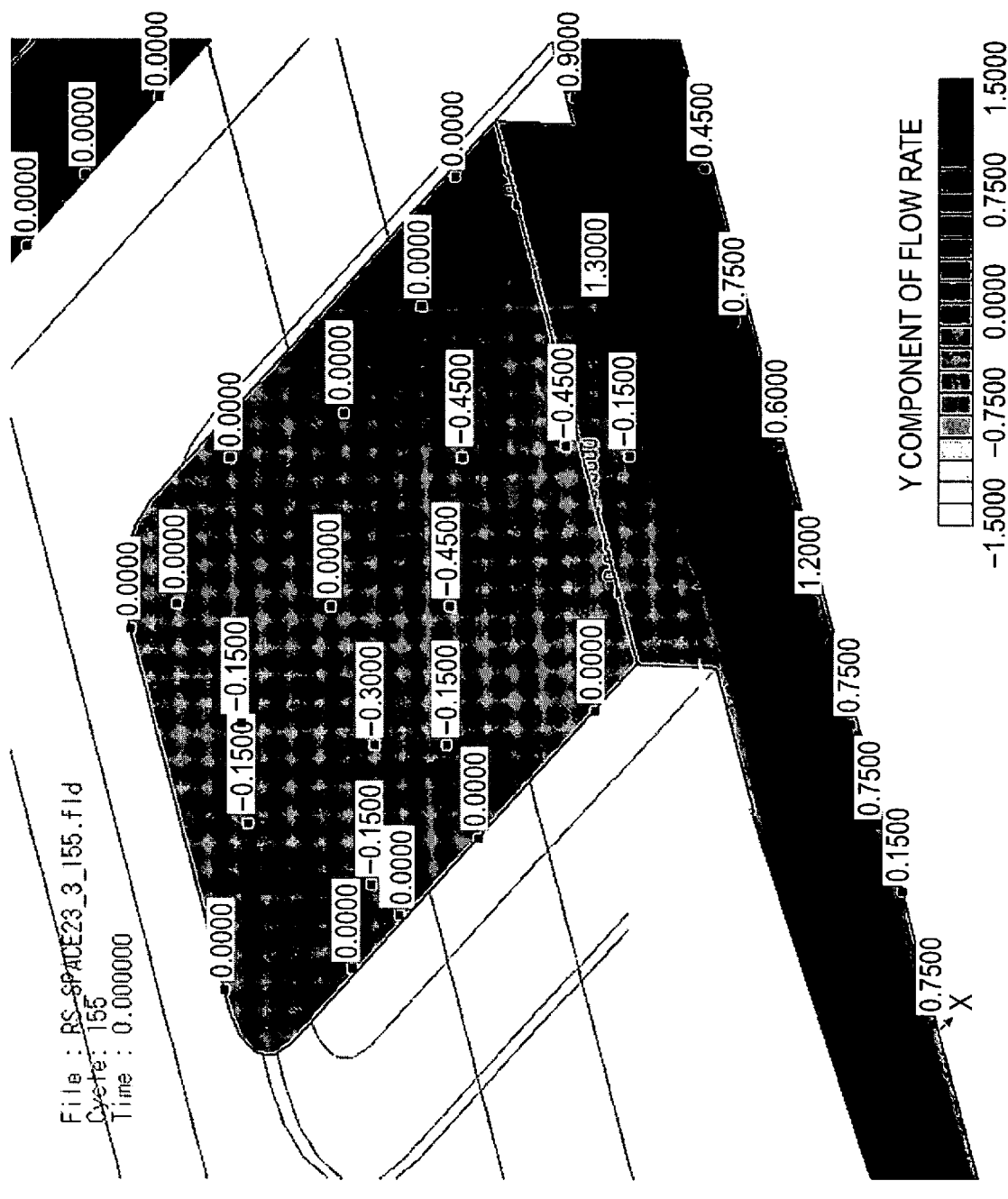
FIG. 12 shows a result of an airflow analysis when the dimension D in FIG. 9 is 5.0 mm.
Figure 13:
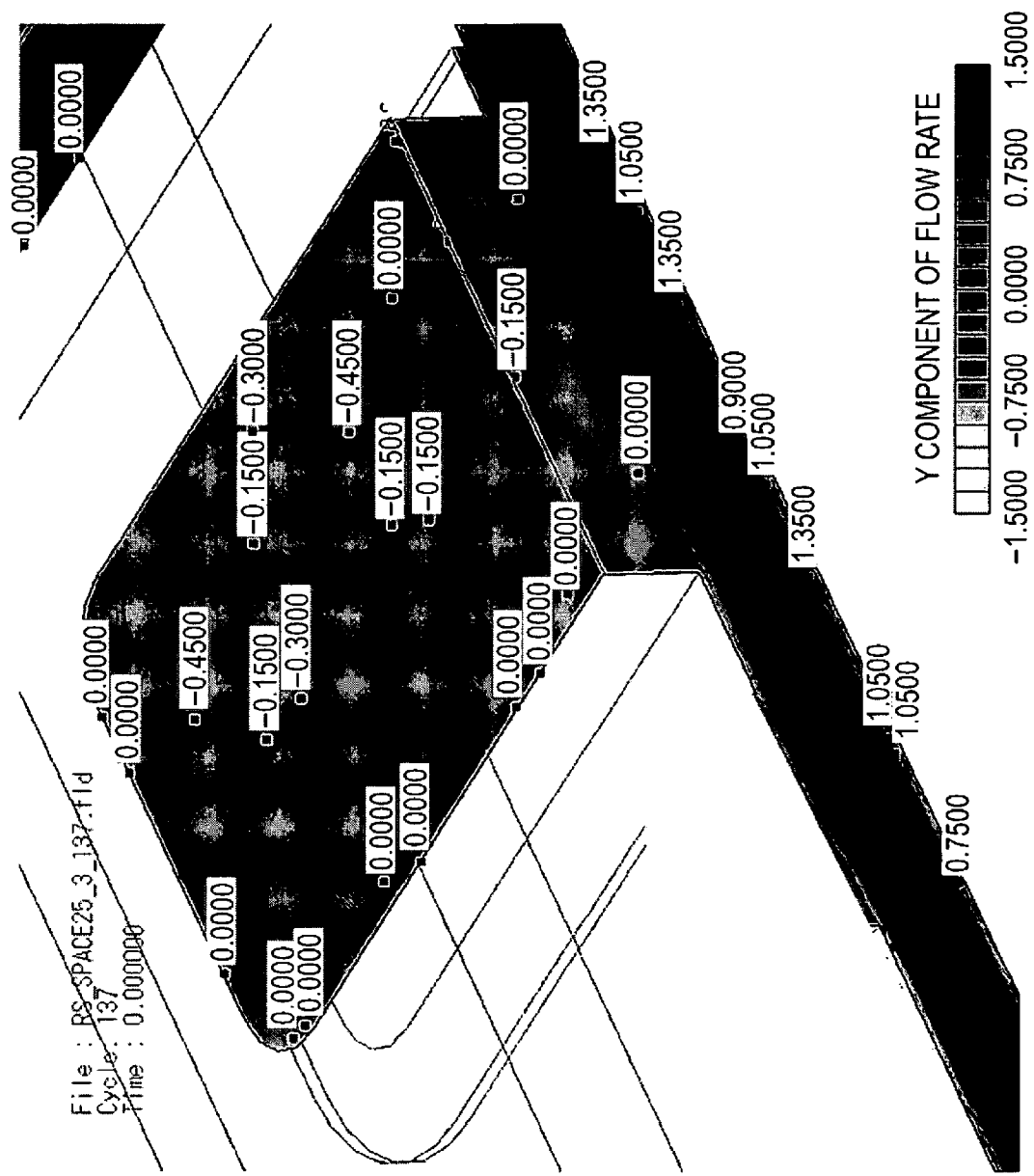
FIG. 13 shows a result of an airflow analysis when the dimension D in FIG. 9 is 7.5 mm.
Figure 14:
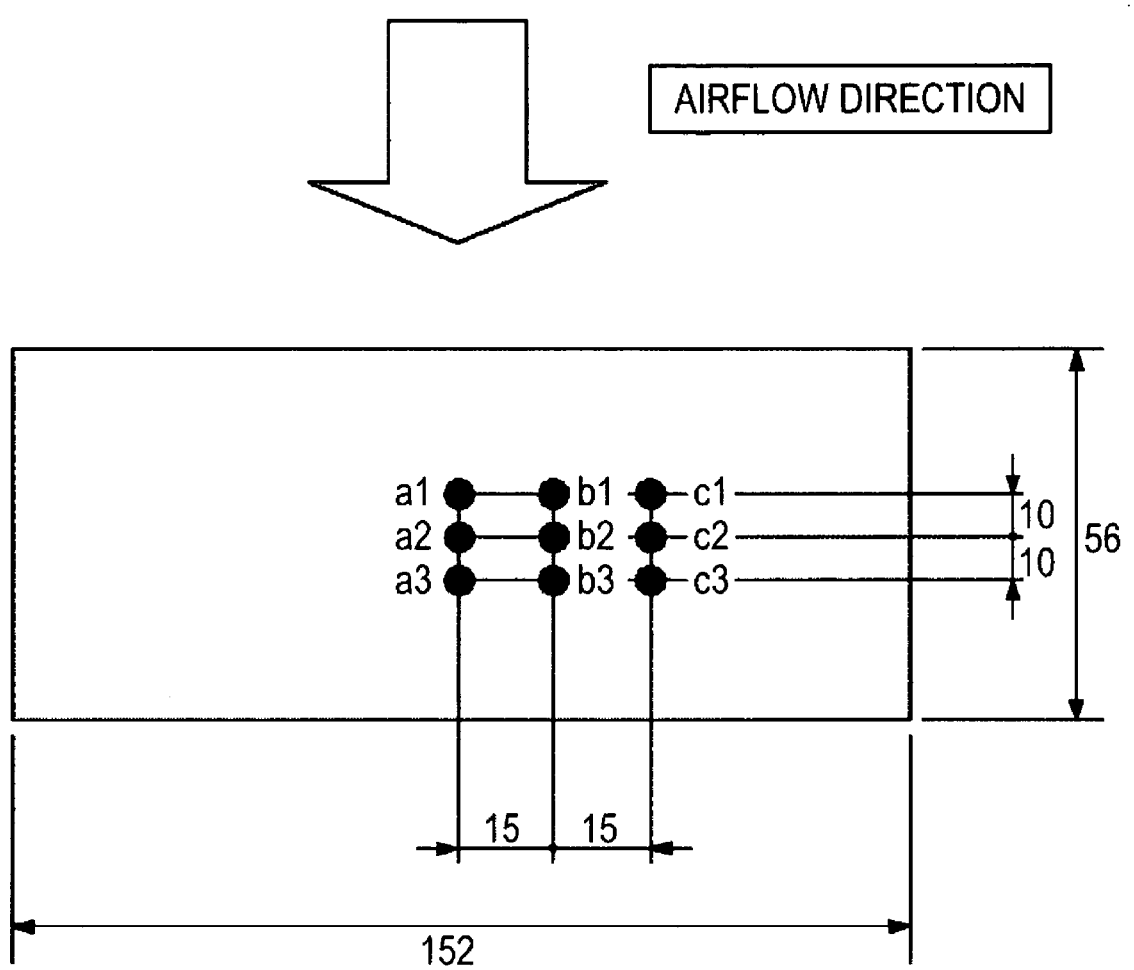
FIG. 14 is an explanatory view of measurement points of flow rate.
Figure 15:
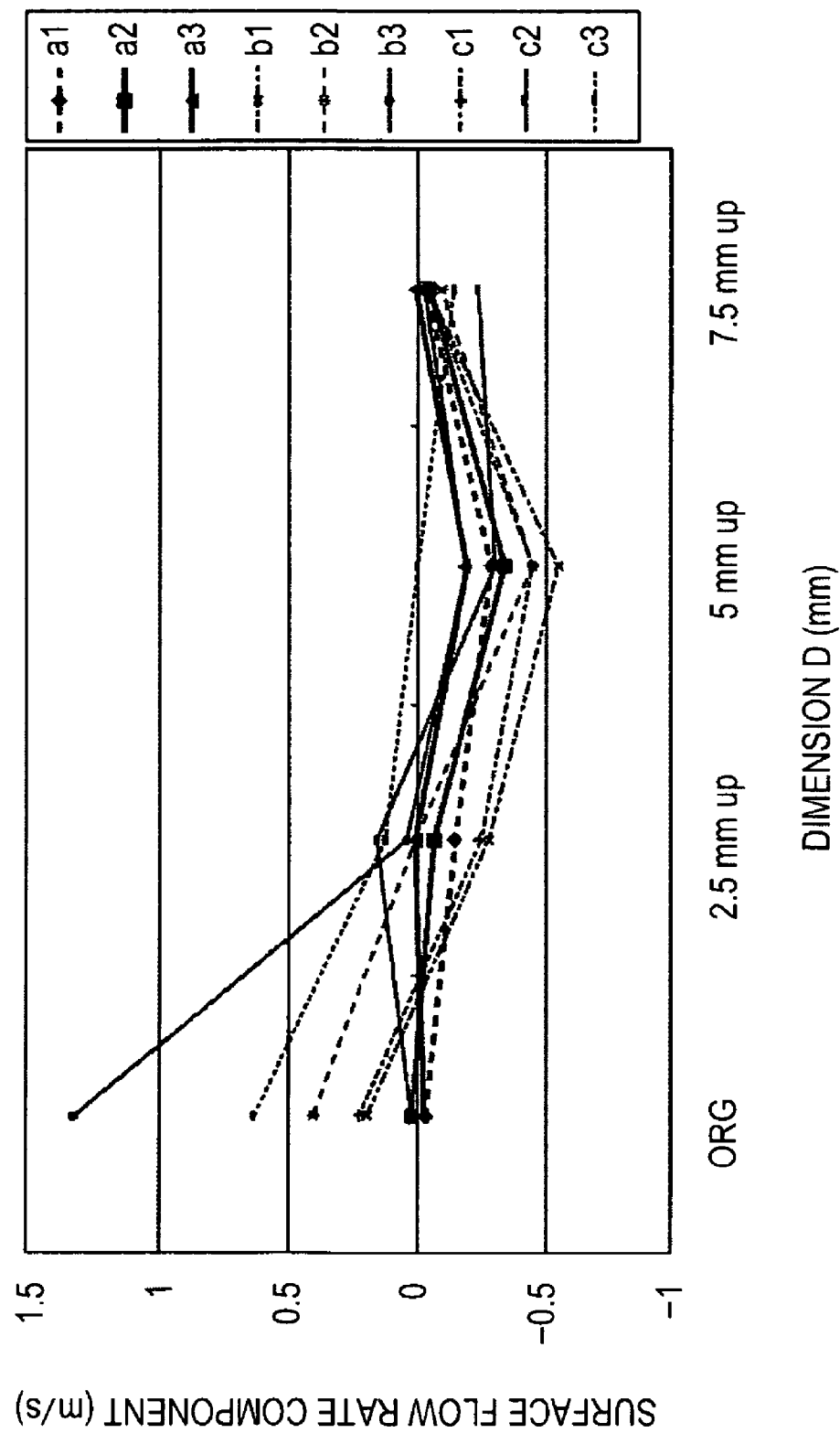
FIG. 15 is a graph showing analysis results of each of the measurement points.
Figure 16:
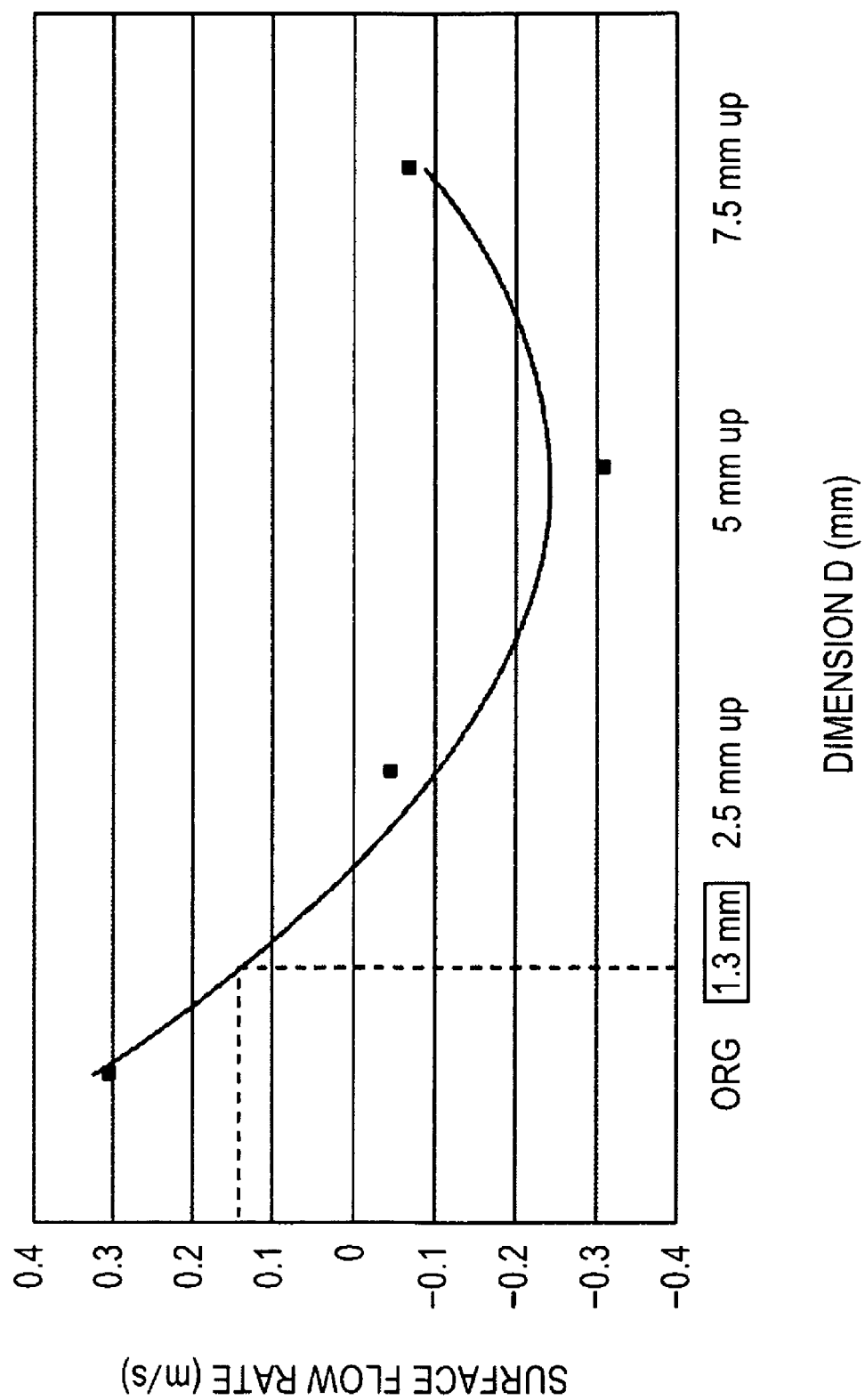
FIG. 16 is a graph showing the relationship between the dimension D and the average of flow rate according to a third embodiment of the present invention.

FIGS. 7 to 9 are not described because the structures are the same as those in the second embodiment. FIGS. 10 to 13 show the results of the flow rate of an airflow on the surface of the optical element 31 that are calculated by an analysis. FIG. 10 shows the case where the dimension D in FIG. 9 is 0 mm (the case where the optical element 31 is disposed at substantially the same position as the outer surface of the casing 37). FIGS. 11, 12, and 13 show the cases where the dimension D in FIG. 9 is 2.5 mm, 5 mm, and 7.5 mm, respectively (the cases where the optical element 31 is disposed inside the casing 37 by 2.5 mm, 5 mm, and 7.5 mm, respectively). FIGS. 10 to 13 show the flow rate distribution of the analysis result. FIG. 14 shows coordinate points that are focused to check the flow rate from the analysis results. FIG. 15 shows the relationship between the dimension D and the flow rate of the airflow at each point. FIG. 16 shows the relationship between the flow rate obtained by averaging the flow rate of each point and the dimension D.

The analysis conditions are as follows.

R: 76 mm The dimension in the direction orthogonal to R is 56 mm.
Flow rate of the outside air: 3.3 m/s
Target gas: air (density: 1.206 kg/m$^3$)
A quadratic approximation curve is determined in FIG. 16.
In the approximation curve, the dimension D at which the flow rate becomes ½ of the original flow rate is determined as D=1.33 mm.

$$R/D=76/1.33=57.1$$

In the above equation, R represents the opening dimension in the direction orthogonal to the flow of the outside air and D represents the distance between the top of the optical element 31 and the outermost surface of the casing 37. According to this analysis result, when the optical element 31 is disposed at a position D that satisfies R/D≦57, the flow rate on the surface of the optical element 31, the surface being in contact with the outside air, is decreased to ½ or less. When the flow rate is decreased to ½ or less, the total amount of impurities passing over the surface of the optical element 31, the surface being in contact with the outside air, is also decreased to ½ or less, and thus the clouding can be suppressed to ½ or less. The advantage achieved by decreasing the flow rate to ½ is not described in this embodiment because the advantage is the same as that described in the second embodiment. If the arrangement is possible, the flow rate can be further decreased by increasing the dimension D, and thus the clouding can also be suppressed.

Fourth Embodiment

A fourth embodiment will now be described.

Figure 17:
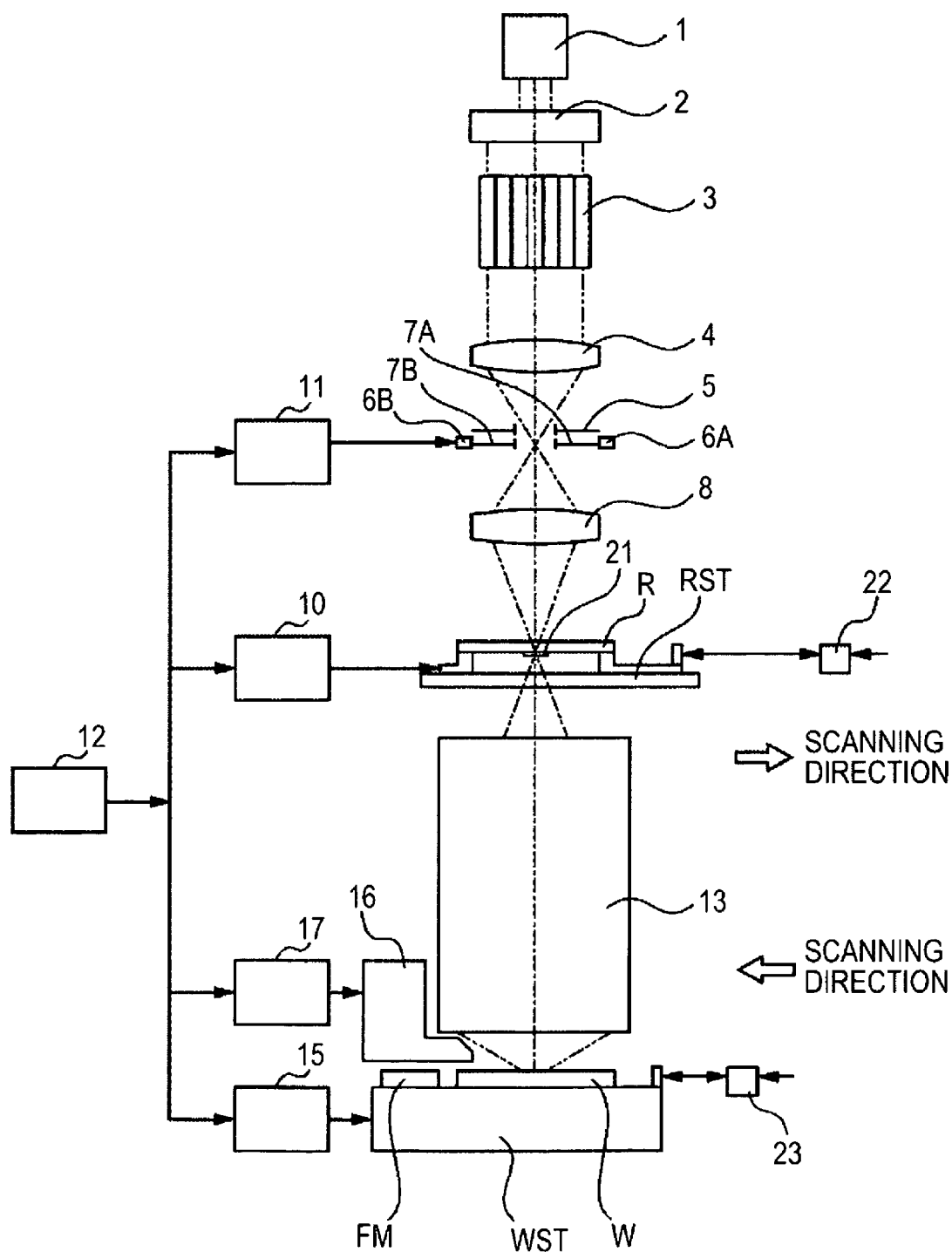
FIG. 17 is a view of a fourth embodiment of the present invention.

FIG. 17 shows the overall structure of a projection exposure apparatus of this embodiment. In FIG. 17, a reticle R is illuminated with a uniform illuminance by a light source 1 and an illumination optical system including an illumination light-shaping optical system 2 to a relay lens system 8 through a rectangular slit-shaped illumination area 21. A circuit pattern image on the reticle R in the slit-shaped illumination area 21 is transferred onto a wafer W via a projection optical system 13. Examples of the usable light source 1 include excimer laser light sources such as an F2 excimer laser, an ArF excimer laser, and a KrF excimer laser; metal vapor laser light sources; pulse light sources such as a harmonic generator of a YAG laser; and continuum light sources such as a continuum source combining a mercury lamp and an elliptical reflecting mirror.

In a pulse light source, the on or off state of the exposure is switched by controlling the power supply from a power supply unit for the pulse light source. In a continuum light source, the on or off state of the exposure is switched with a shutter in the illumination light-shaping optical system 2. As described below, in the present embodiment, a movable blind (variable field stop) 7 is provided. The on or off state of the exposure may be switched by opening or shutting the movable blind 7.

In FIG. 17, the light flux of illuminating light from the light source 1 is controlled to a predetermined size with the illumination light-shaping optical system 2, and the illuminating light enters a fly's eye lens 3. A large number of secondary light sources are provided on the emitting surface of the fly's eye lens 3. The illuminating light from these secondary light sources is converged with a condenser lens 4 and enters the movable blind (variable field stop) 7 through a fixed field stop 5. In FIG. 17, the field stop 5 is disposed between the condenser lens 4 and the movable blind 7. Alternatively, the field stop 5 may be disposed adjacent to the relay lens system 8.

A rectangular slit-shaped opening is provided in the field stop 5. The light flux passing through the field stop 5 becomes a light flux having a cross-section of the rectangular slit and is incident on the relay lens system 8. The longitudinal direction of the slit corresponds to the direction perpendicular to the drawing. The relay lens system 8 is a lens system for conjugating the movable blind 7 and the surface of the reticle R that has a pattern. The movable blind 7 includes two blades (light-shielding plates) 7A and 7B specifying the width in the scanning direction (X direction) described below and two blades (not shown in the figure) specifying the width in the non-scanning direction perpendicular to the scanning direction. The blades 7A and 7B specifying the width in the scanning direction are supported by driving parts 6A and 6B, respectively, so that the blades can be independently moved in the scanning direction. The two blades (not shown in the figure) specifying the width in the non-scanning direction are also supported so that the blades can be independently driven. In this embodiment, in the slit-shaped illumination area 21 on the reticle R, the area being specified with the fixed field stop 5, only a desired exposure area that is further specified with the movable blind 7 is irradiated with the illuminating light. The relay lens system 8 is a double-sided telecentric optical system, and the telecentricity is maintained in the slit-shaped illumination area 21 on the reticle R.

The reticle R is held with a reticle stage RST. An interferometer 22 detects the position of the reticle stage RST, and the reticle stage RST is driven by a reticle-stage driving unit 10. An optical element G1 (not shown) is held under the reticle R. When the reticle stage RST is driven by scanning, the optical element G1 is scanned with the reticle R. The circuit pattern image on the reticle R, which is disposed in the slit-shaped illumination area 21 and which is further specified with the movable blind 7, is subjected to projection exposure on the wafer W via the projection optical system 13.

In a two-dimensional plane perpendicular to the optical axis of the projection optical system 13, the scanning direction of the reticle R relative to the slit-shaped illumination area 21 is defined as "+X direction" (or "−X direction") and the direction parallel to the optical axis of the projection optical system 13 is defined as "Z direction".

In this case, the reticle stage RST is driven by the reticle-stage driving unit 10 and scans the reticle R in the scanning direction (+X direction or −X direction). A movable blind control unit 11 controls the operations of the driving parts 6A and 6B for the scanning direction and the driving parts (not shown in the figure) for the non-scanning direction of the movable blind 7. A main control system 12, which controls the operations of overall apparatus, controls the reticle-stage driving unit 10 and the movable blind control unit 11.

On the other hand, the wafer W is transferred with a wafer-transfer unit (not shown in the figure) and is then held with a wafer stage WST. The wafer stage WST positions the wafer W in the plane perpendicular to the optical axis of the projection optical system 13. The wafer stage WST includes an XY stage for scanning the wafer W in ±X direction and a Z stage for positioning the wafer W in the Z direction. The position of the wafer stage WST is detected by an interferometer 23. An off-axis alignment sensor (also referred to as alignment scope) 16 is provided at the upper part of the wafer W. The alignment sensor 16 detects an alignment mark on the wafer. The result is processed by a control unit 17 and is sent to the main control system 12. The main control system 12 controls the positioning operation and the scanning operation of the wafer stage WST via a wafer-stage driving unit 15.

When the pattern image on the reticle R is exposed by a scanning exposure method on each shot area on the wafer W through the projection optical system 13, the reticle R is scanned at a rate of VR in the −X direction (or +X direction) relative to the slit-shaped illumination area 21 that is specified with the field stop 5 in FIG. 17. In addition, the wafer W is synchronously scanned at a rate of VW (=β·VR) (wherein β represents a projection magnification of the projection optical system 13) in the +X direction (or −X direction) while the reticle R is scanned. Thus, the circuit pattern image on the reticle R is transferred one after another onto the shot areas on the wafer W.

In the above exposure apparatus of the fourth embodiment, a part or all of the projection optical system 13 or the illumination optical system is covered with a casing having a hermetically sealed structure and has the following structure: A rectifying plate of the first embodiment is provided on the surface of an optical element being in contact with the outside air. Alternatively, as described in the second embodiment, the optical element is disposed at a position where the flow rate of an airflow on the surface of the optical element being in contact with the outside air is ½ or less of the flow rate on the outermost surface of the casing. Alternatively, the optical element and the casing are disposed so as to satisfy the conditions described in the third embodiment. Thereby, the clouding (contamination) on the surface of the optical element being in contact with the outside air can be suppressed.

Fifth Embodiment

Figure 18:
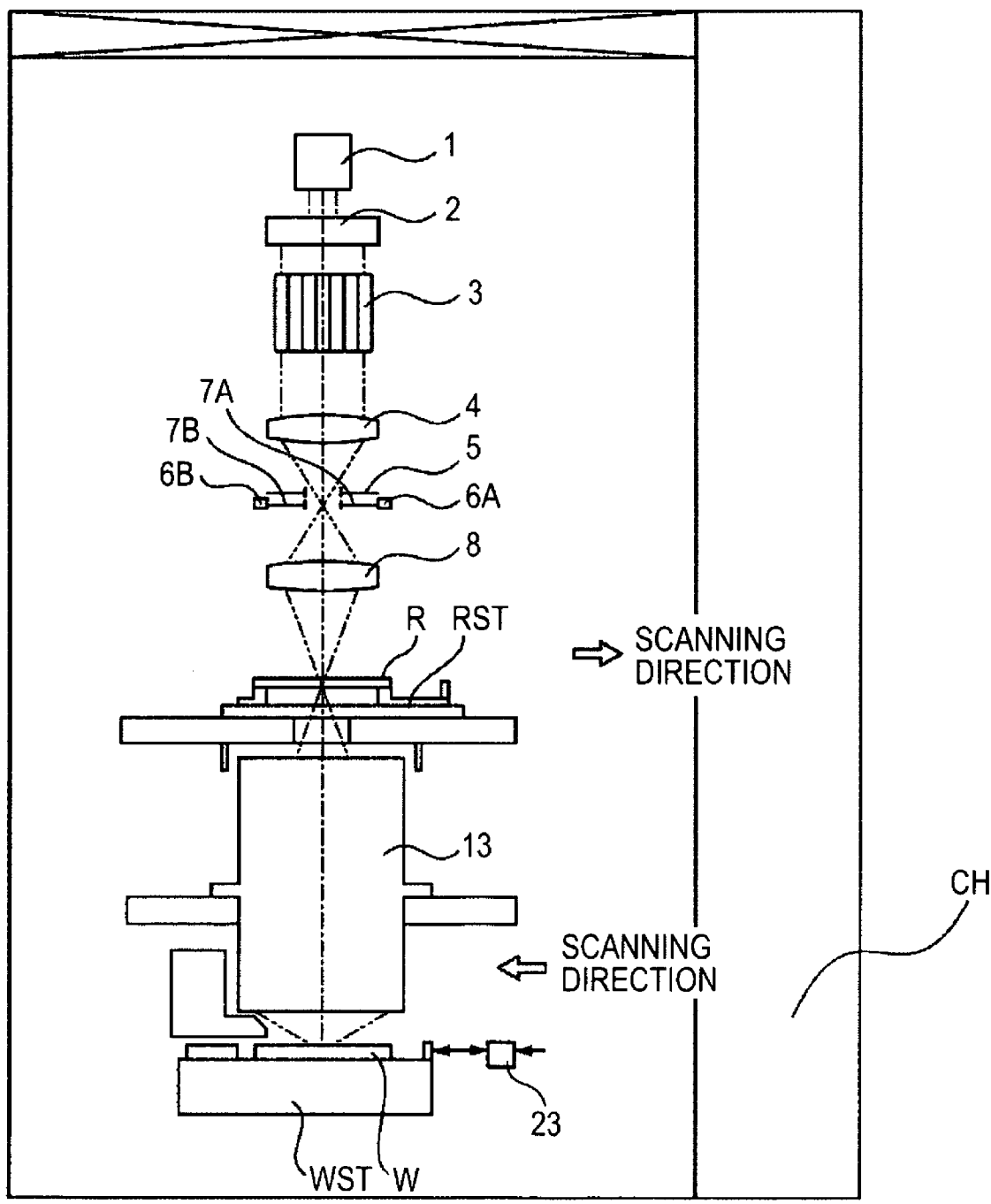
FIG. 18 is a view of a fifth embodiment of the present invention.
Figure 19:
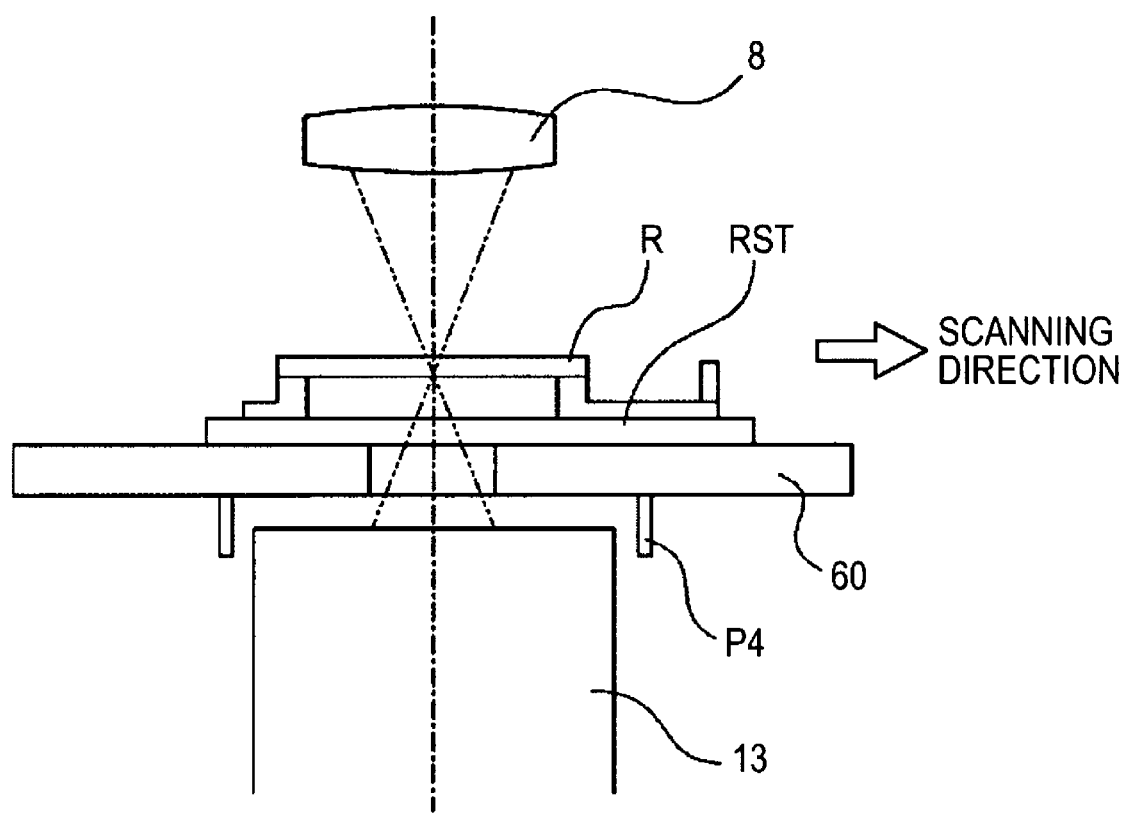
FIG. 19 is an enlarged view of the relevant part of FIG. 18.

A fifth embodiment will now be described. FIG. 18 shows the overall structure of an apparatus and the description of the same components as those in FIG. 17 is omitted. The entire apparatus is installed in an environmental chamber CH and is placed in a temperature-controlled space. FIG. 19 is an enlarged view of a reticle, a part of a projection optical system 13, and the vicinity thereof. A reticle stage RST is disposed on a reticle stage base 60. A predetermined space is provided between the reticle stage base 60 and the projection optical system 13. A rectifying plate P4 is provided from the reticle stage base 60 to the periphery of the projection optical system 13.

The operation will now be described. The entire apparatus is installed in the environmental chamber CH, which supplies temperature-controlled air in order to maintain the temperature environment in the vicinity of the apparatus. With respect to the temperature-controlled air, impurities such as an acid and ammonia in the air are removed as much as possible with an impurity-removing filter (not shown in the figure). The temperature of the air is then controlled and is supplied. Therefore, an airflow is present in the vicinity of the projection optical system 13. The airflow is also present at the upper part of the projection optical system 13 adjacent to the reticle shown in FIG. 18. As described above, the impurities in the air supplied from the environmental chamber CH are removed with the impurity-removing filter, but it is difficult to remove the impurities completely. It is also difficult to completely clean the parts used in the apparatus installed in the environmental chamber CH. Consequently, organic substances and inorganic substance are generated from mounted components, mechanical components, and electrical components, for example, a cable. An optical element is provided on the upper part of the projection optical system 13. Therefore, when exposure light is radiated in a state where a gas in the vicinity of the optical element contains impurities, substances that adhere on the surface of the optical element are generated by a photochemical reaction, resulting in clouding on the surface of the optical element. The clouding can be suppressed by decreasing the flow rate of the airflow over the surface of the optical element being in contact with the outside air. In the fifth embodiment, the rectifying plate P4 is provided on the reticle stage base 60, thereby decreasing the flow rate of the airflow on the surface of the optical element of the projection optical system 13, the surface being in contact with the outside air.

Aluminum, a stainless steel, or the like may be used as the material of the rectifying plate P4, and the rectifying plate P4 can be sufficiently cleaned by washing without performing any surface treatment. For example, the rectifying plate P4 having a cleanliness of about 0.05 μg/m$^3$, which is up to the detection limit in an organic substance degassing measurement by means of gas chromatography, can be used. Also, when a surface treatment is performed or a porous material such as a ceramic is used, the rectifying plate P4 having the equivalent cleanliness may be used. A small space is provided between the rectifying plate P4 and the projection optical system 13 in order to prevent the following phenomenon: The vibration, the deformation, or the like generated during the driving of the reticle stage RST is transmitted to the projection optical system 13 through the reticle stage base 60 and the rectifying plate P4, and affects the imaging performance. In this embodiment, the rectifying plate P4 is provided, but the flow rate of the airflow can be further decreased by adding the constituent factors described in the first embodiment to the third embodiment to the projection optical system 13. The rectifying plate P4 in FIG. 19 has a cylindrical shape, but the shape is not limited thereto. The rectifying plate P4 may have a frusto-conical shape or the like depending on the shape of the projection optical system 13.

Sixth Embodiment

Figure 20:
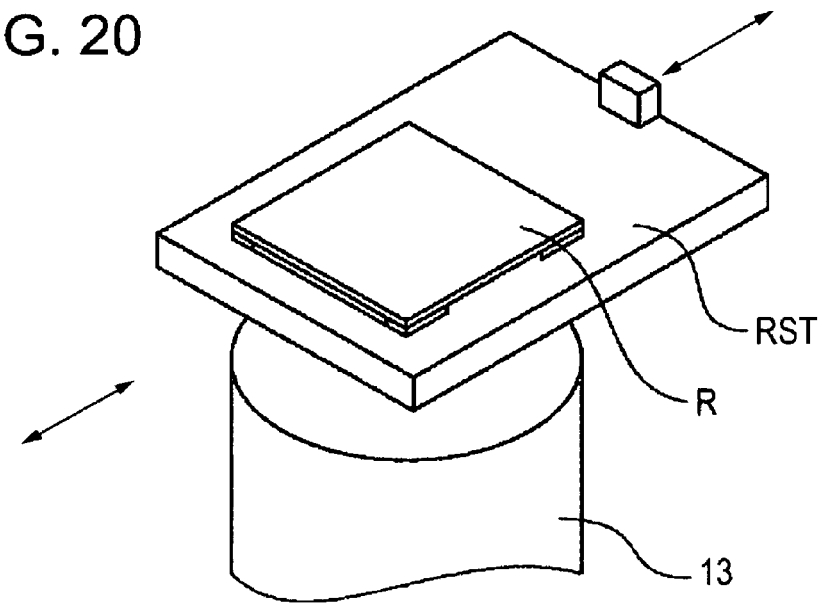
FIG. 20 is a view of a sixth embodiment of the present invention.
Figure 21:
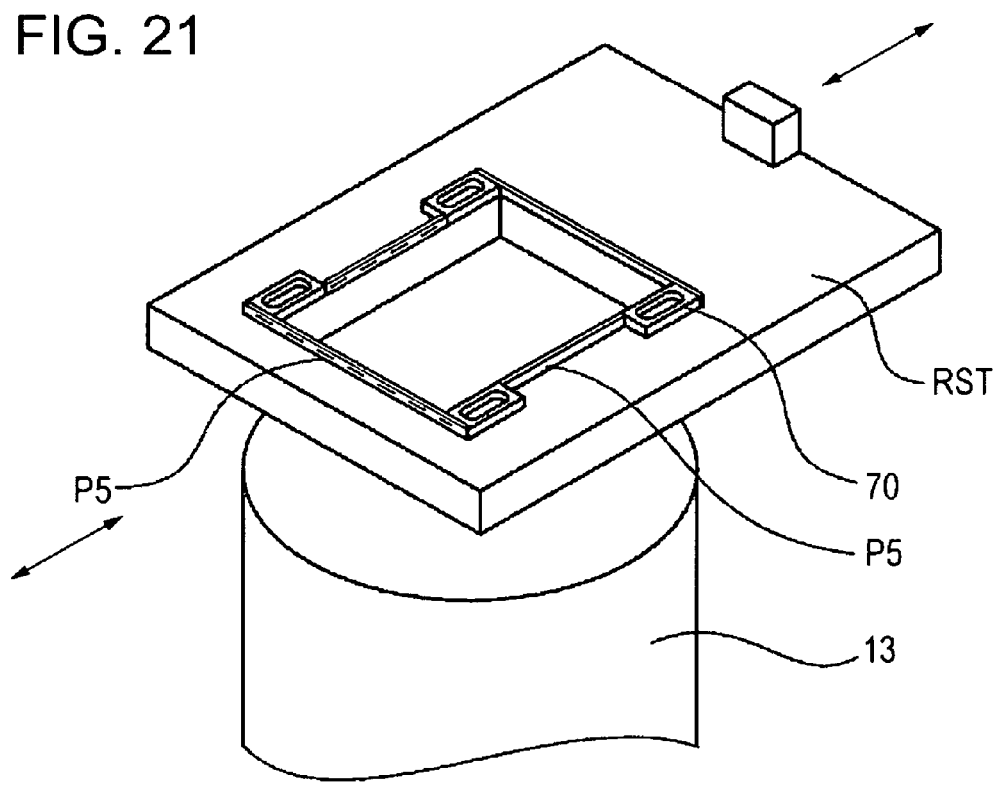
FIG. 21 is a view of the sixth embodiment of the present invention.

A sixth embodiment will now be described with reference to FIGS. 20 and 21. FIG. 20 is a perspective view of a reticle stage RST. FIG. 20 shows a state in which a reticle R is held by suction on the reticle stage RST. FIG. 21 shows a state in which the reticle R is removed from the state shown in FIG. 20. The reticle R is held by suction by four suction parts 70 provided on the reticle stage RST. The suction parts 70 are provided at four positions on the reticle stage RST in the form of a protrusion. Accordingly, spatial clearances are provided between the four positions. When an airflow is present on the reticle stage RST, a gas flows from the clearances to the side of the pattern surface of the reticle R. In particular, in scanning exposure apparatuses, the gas flows into the clearances more easily because of the scanning of the reticle stage RST for exposure. In addition, in scanning exposure apparatuses, the position of the reticle stage RST is generally detected with an interferometer. In order to maintain the temperature stability of the optical path of the interferometer, temperature-controlled air is supplied to a reticle stage RST space. Consequently, an airflow is constantly present in the space.

A pellicle is generally provided on the side of the pattern surface of the reticle R in order to prevent dust from being adhered on the pattern surface. Therefore, the clouding of the pattern surface caused by flowing of the gas can be prevented. Instead, the clouding is generated on the surface of the pellicle. To overcome this problem, a rectifying plate P5 shown in FIG. 21 is provided between the suction parts 70. The rectifying plate P5 may be integrally formed with the reticle stage RST. As described above, aluminum, a stainless steel, or the like may be used as the material of the rectifying plate P5, and the rectifying plate P5 can be sufficiently cleaned by washing without performing any surface treatment. For example, the rectifying plate P5 having a cleanliness of about 0.05 µg/m³, which is up to the detection limit in an organic substance degassing measurement by means of gas chromatography, can be used. Also, when a surface treatment is performed or a porous material such as a ceramic is used, the rectifying plate P5 having the equivalent cleanliness may be used. Since the rectifying plate P5 is mounted on the reticle stage RST, the material and the shape of the rectifying plate P5 may be specified so as to provide a characteristic value (characteristic frequency or natural vibration frequency) equal to or larger than the control frequency of the reticle stage RST.

In the sixth embodiment, a countermeasure for a gas flow into the side of the pattern surface of the reticle R has been described, but a rectifying plate may be provided on the glass surface opposite to the pattern surface of the reticle R. When the rectifying plate is used for a scanning exposure apparatus, the rectifying plate may be provided at the front and the back of the reticle R.

When a reference mark for alignment is disposed on the reticle stage RST, similar rectifying plates may be provided on the side of the pattern surface of the reference mark and/or the side of the glass surface.

Seventh Embodiment

Figure 22:
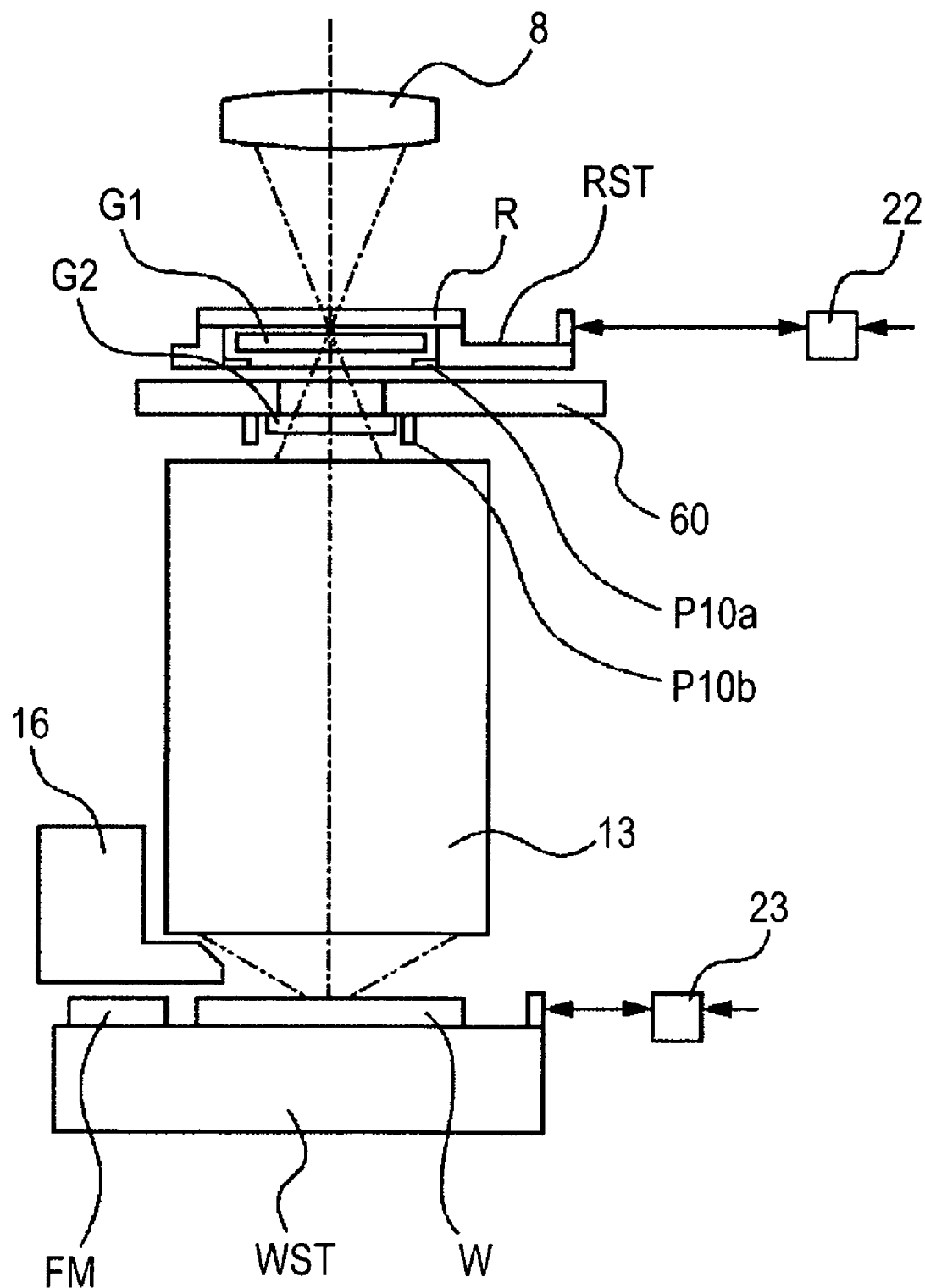
FIG. 22 is a view of a seventh embodiment of the present invention.

A seventh embodiment will now be described with reference to FIG. 22. The description of the same components as those in FIG. 17 is omitted. The difference from the exposure apparatus in FIG. 17 is that compensating optical elements G1 and G2 are provided adjacent to the bottom surface of the reticle R and adjacent to the projection optical system 13, respectively. The compensating optical element G1 is held with the reticle stage RST. When the reticle stage RST is used in a scanning exposure apparatus, the compensating optical element G1 is scanned together with a reticle R. The compensating optical element G2 is held with the projection optical system 13 or a reticle stage base 60. When used in a scanning exposure apparatus, the compensating optical element G2 is held on a fixed part. The compensating optical elements G1 and G2 are optical elements for compensating an aberration such as a distortion due to the surface shape of the reticle R and aberrations of the projection optical system 13. Since the compensating optical elements G1 and G2 are disposed on the optical axis through which exposure light passes, clouding of the compensating optical elements G1 and G2 causes a degradation of the illuminance. Therefore, it is important to prevent the clouding from being generated. The countermeasure for the compensating optical element G2 will be described. A rectifying plate P10b is provided as in the countermeasure described in the fifth embodiment in which the flow rate of an airflow on the surface of an optical element disposed at the top of the projection optical system 13, the surface being in contact with the outside air, is decreased. As in the fifth embodiment, the rectifying plate P10b may be held with either the reticle stage base 60 or the projection optical system 13.

The countermeasure for the compensating optical element G1 will be described. The compensating optical element G1 is held with the reticle stage RST, and is scanned together with the reticle stage RST. The reticle stage RST is generally held with an air guide. Accordingly, a clearance is provided between the reticle stage RST and the reticle stage base 60. A gas flows into the compensating optical element G1 from this clearance. As a countermeasure for this gas flow, the reticle stage RST includes a rectifying plate P10a. The rectifying plate P10a is disposed at the side of the bottom surface of the reticle stage RST (the side adjacent to the reticle stage base 60), and forms a space in which the airflow stagnates along the bottom surface of the compensating optical element G1. This structure decreases the flow rate on the surface of the compensating optical element G1, the surface being adjacent to the projection optical system 13 and being in contact with the outside air, to suppress the clouding. With respect to the other surface of the compensating optical element G1, the surface being adjacent to the reticle R, the clouding can be suppressed by providing a rectifying plate P5 as in the sixth embodiment.

The rectifying plate P10a may be integrally formed with the reticle stage RST. As described above, aluminum, a stainless steel, or the like may be used as the material of the rectifying plates P10a and P10b, and the rectifying plates P10a and P10b can be sufficiently cleaned by washing without performing any surface treatment. For example, the rectifying plates P10a and P10b having a cleanliness of about 0.05 µg/m³, which is up to the detection limit in an organic substance degassing measurement by means of gas chromatography, can be used. Also, when a porous material such as a ceramic is used, the rectifying plates P10a and P10b having the equivalent cleanliness may be used. Since the rectifying plate P10a is mounted on the reticle stage RST, the material and the shape of the rectifying plate P10a may be specified so as to provide a characteristic frequency value equal to or larger than the control frequency of the reticle stage RST.

In the description of the present embodiment, both the compensating optical element G1 and the compensating optical element G2 are provided. Alternatively, just one of the compensating optical elements G1 and G2 may be provided.

Eighth Embodiment

An eighth embodiment will now be described with reference to FIGS. 23 and 24.

The periphery of a reticle R will be described with reference to FIG. 23. The description of the same components as those in FIG. 17 is omitted.

Figure 23:
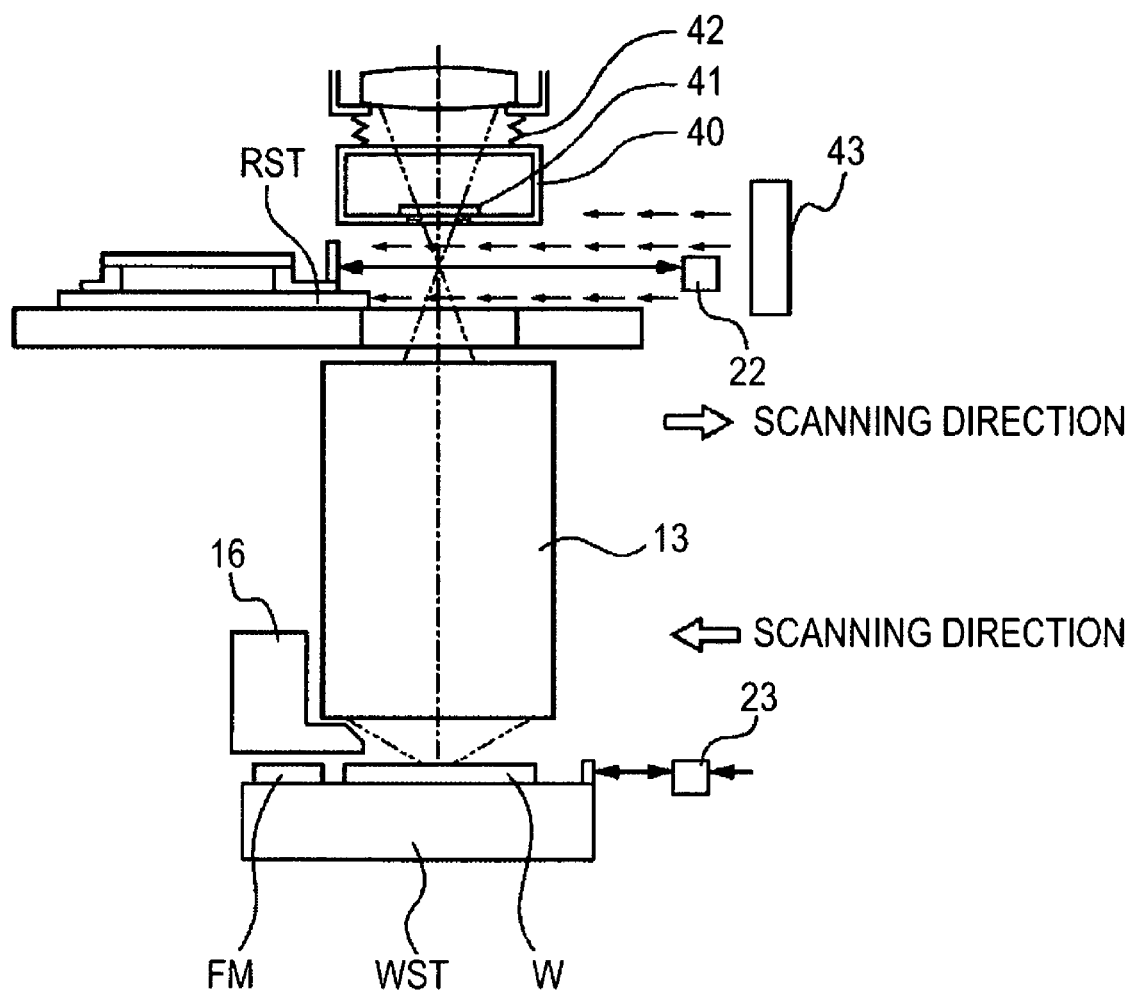
FIG. 23 is a view of an eighth embodiment of the present invention.

In FIG. 23, a TTL (through-the-lens) detection system AS (alignment scope 40-42) is provided above the reticle. The depiction of the TTL detection system AS is omitted in FIG. 17. The detection system AS can detect a reference mark (not shown in the figure) provided on the reticle stage RST or a mark provided on the reticle R. The detection system AS can also detect a mark on a reference mark FM provided on a wafer stage WST via a projection optical system 13.

The detection system AS includes a casing 40 having a hermetically sealed structure. The inside of the casing 40 is replaced with an inert gas. An optical element 41 that is in contact with the outside air is provided at the reticle side of the detection system AS. The casing 40 of the detection system AS is connected to a casing of an illumination optical system with a sealing component 42 disposed therebetween. The sealing component 42 is composed of a material having hermeticity and flexibility, and prevents a relay lens 8 of the illumination optical system from being in contact with the outside air. Being connected with the flexible material, the illumination optical system and the detection system AS are vibrationally insulated.

A temperature-controlled gas supply port 43 is provided in order to stabilize the temperature of the optical path of an interferometer 22 that detects the position of the reticle stage RST. The arrows in the figure show the flow of the temperature-controlled air. The temperature range of the air is controlled to, for example, ±0.05° C. or less with a temperature control system provided in a chamber (not shown in the figure) and is then supplied as the temperature-controlled air. An impurity-removing filter is provided in a circulating system and the temperature-controlled air that does not contain impurities is supplied.

As described in the third embodiment, if the optical element 41 can be disposed at a position sufficiently inside the detection system (casing 40), the flow rate of an airflow on the surface of the optical element 41 being in contact with the outside air can be decreased. In view of the restriction of the arrangement, the illumination optical system is disposed above the detection system AS and the size of the illumination optical system is significantly affected by a distance from the reticle surface. The reason for this is based on the following: In order to increase the precision of the apparatus and to perform miniaturization, when the NA of exposure light is increased and the illumination optical system is away from the reticle surface, the diameter of the optical system must be increased.

In view of the arrangement of the detection system AS, a mirror for reflective surface of the interferometer 22 serving as a position detector is provided on the reticle stage RST. The optical axis of the interferometer is generally set at the same height as that of the reticle pattern surface in order to minimize the Abbe error. Therefore, the size of the reflective mirror for the interferometer is equal to or larger than the thickness of the reticle and the detection system AS is disposed at a position where an interference with the reflective mirror for the interferometer is prevented. Consequently, when the detection system AS is disposed so as to be close to the reticle surface, the position of the detection system AS is limited to the position where the interference with the reflective mirror for the interferometer is prevented.

The detection system AS includes a driving system (not shown) to measure the reference mark provided on the reticle R or the reticle stage RST, or the reference mark FM on the wafer stage WST, to avoid an interference with the exposure light during exposure, and to detect any image height. Therefore, the detection system AS requires a predetermined thickness.

For these reasons, the optical element 41 may not be disposed at a position sufficiently inside the surface of the detection system AS.

Figure 24:
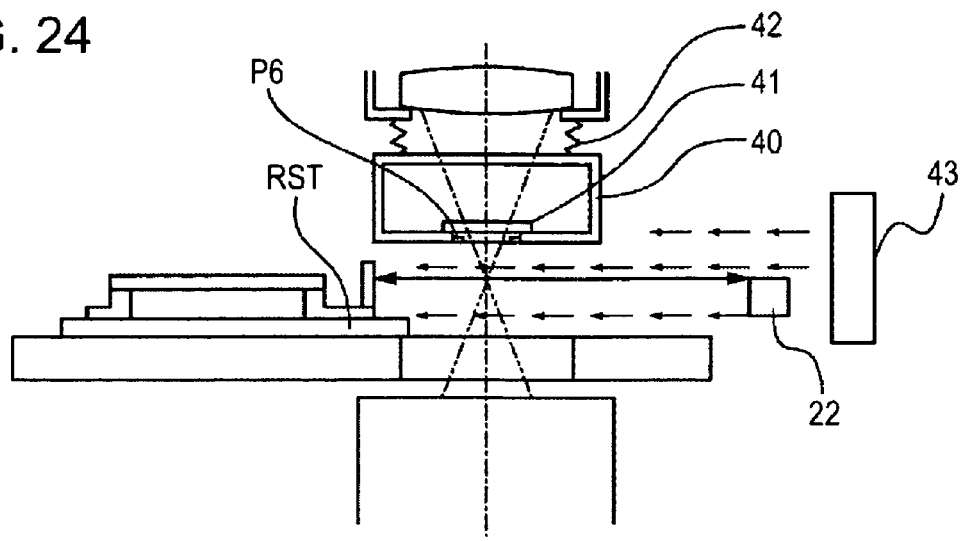
FIG. 24 is an enlarged view of the relevant part of FIG. 23.

FIG. 24 is an enlarged view of a peripheral part of the reticle. In this embodiment, a rectifying plate P6 is provided at the reticle R side of the casing 40, and a space in which a gas stagnates is formed between the optical element 41 and the rectifying plate P6. This structure decreases the flow rate of an airflow on the surface of the optical element 41 being in contact with the outside air to suppress the clouding of the optical element 41.

Aluminum, a stainless steel, or the like may be used as the material of the rectifying plate P6, and the rectifying plate P6 can be sufficiently cleaned by washing without performing any surface treatment. For example, the rectifying plate P6 having a cleanliness of about 0.05 µg/m³, which is up to the detection limit in an organic substance degassing measurement by means of gas chromatography, can be used. Also, when a surface treatment is performed or a porous material such as a ceramic is used, the rectifying plate P6 having the equivalent cleanliness may be used.

The inside edge of the rectifying plate P6 may be folded towards the reticle to further reduce a flow rate of the gas. A predetermined slope may also be provided to the rectifying plate P6.

In addition, this embodiment may be combined with the third embodiment. The optical element 41 is disposed at a position inside the detection system AS within an acceptable arrangement space, and the rectifying plate P6 is provided in the casing 40. Thus, the flow rate of the airflow on the surface of the optical element 41 can be decreased.

Ninth Embodiment

Figure 25:
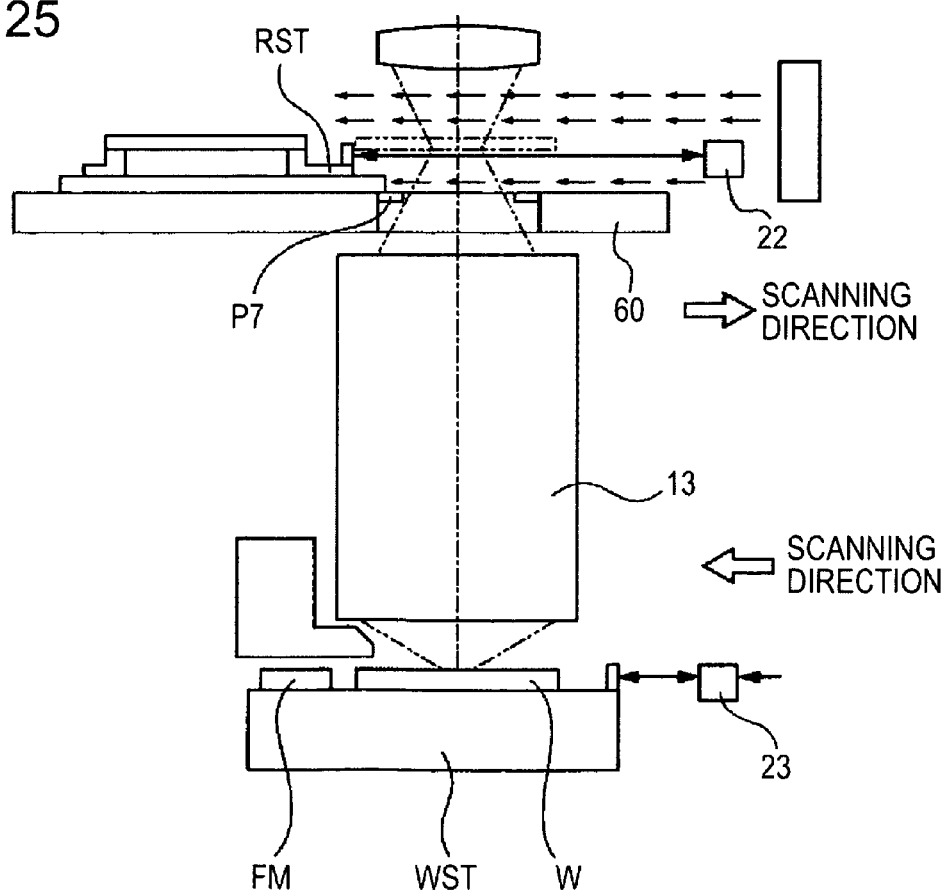
FIG. 25 is a view of a ninth embodiment of the present invention.
Figure 26:
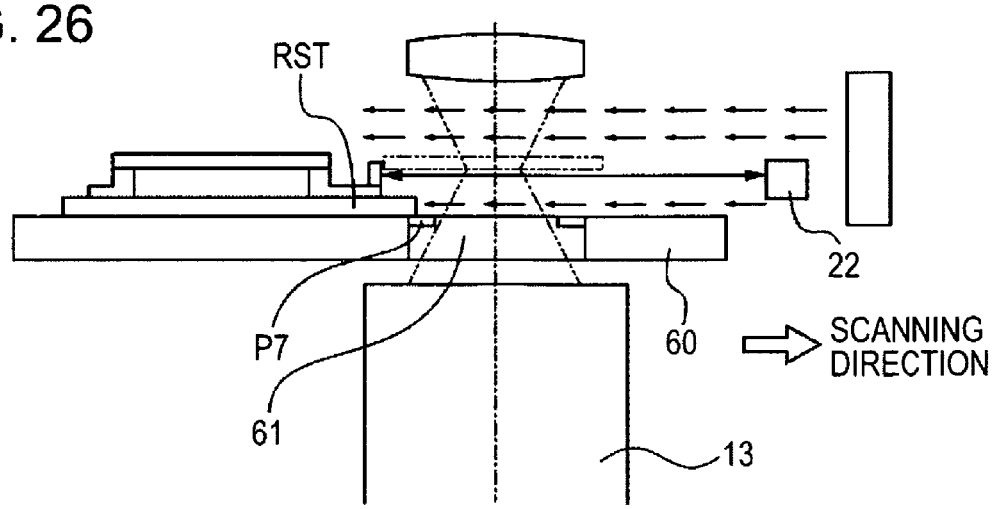
FIG. 26 is an enlarged view of the relevant part of FIG. 25.

A ninth embodiment will now be described with reference to FIGS. 25 and 26. The description of the same components as those in FIG. 18 is omitted. The ninth embodiment focuses on a decrease in the flow rate when temperature-controlled air for controlling the atmosphere in a reticle stage RST space flows into the upper surface of a projection optical system 13, the surface being adjacent to a reticle. FIG. 26 is an enlarged view of the peripheral part of the upper surface of the projection optical system 13, the surface being adjacent to the reticle. A reticle stage base 60 includes an opening 61 for guiding exposure light to the projection optical system 13. Temperature-controlled air, shown by the arrows in the figure, flows in the reticle stage RST space. This temperature-controlled air flows from the opening 61 toward the upper surface of the projection optical system 13. In particular, in a scanning exposure apparatus, the reticle stage RST is moved by a scanning operation, as shown in FIG. 25. Therefore, the upper part of the opening 61 is uncovered and the temperature-controlled air easily flows into the upper part of the projection optical system 13. Consequently, a rectifying plate P7 is provided on the upper surface side (reticle stage side) of the opening 61 provided in the reticle stage base 60 so that a space where an airflow stagnates is formed between the projection optical system 13 and the rectifying plate P7. Thus, the flow rate of the airflow on the surface of an optical element provided on the top surface of the projection optical system 13, the surface being in contact with the outside air, can be decreased.

Aluminum, a stainless steel, or the like may be used as the material of the rectifying plate P7, and the rectifying plate P7 can be sufficiently cleaned by washing without performing any surface treatment. For example, the rectifying plate P7 having a cleanliness of about 0.05 $\mu g/m^3$, which is up to the detection limit in an organic substance degassing measurement by means of gas chromatography, can be used. Also, when a surface treatment is performed or a porous material such as a ceramic is used, the rectifying plate P7 having the equivalent cleanliness may be used.

The inside edge of the rectifying plate P7 may be folded towards the reticle to further reduce a flow rate of the gas. A predetermined slope may also be provided to the rectifying plate P7.

Instead of forming a rectifying plate P7, the shape of the opening 61 may be, for example, a frusto-conical shape as long as the opening 61 does not interfere with the exposure light flux.

Tenth Embodiment

Figure 27:
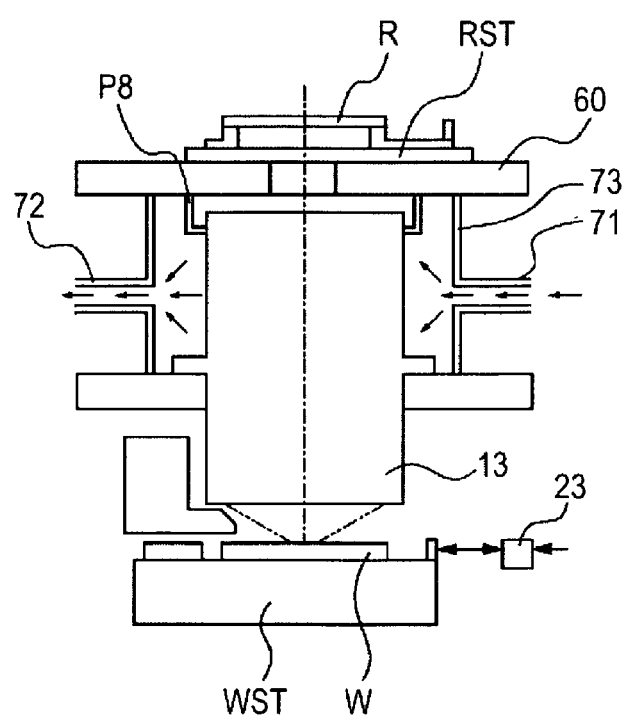
FIG. 27 is a view of a tenth embodiment of the present invention.

A tenth embodiment will now be described with reference to FIG. 27. The description of the same components as those in FIG. 18 is omitted. In FIG. 27, temperature-controlled air is supplied from an environmental chamber (not shown in the figure) in order to keep the temperature of the projection optical system 13 constant or to prevent a thermal disturbance. A cover 73 is provided around the projection optical system 13, and the cover 73 includes an inlet (supply port) 71 and an outlet (exhaust port) 72 for the temperature-controlled air. Furthermore, a rectifying plate P8 is provided in order to prevent the temperature-controlled air from flowing to the upper surface of the projection optical system 13, the surface being adjacent to the reticle. The rectifying plate P8 may be fixed on the projection optical system 13 or may be fixed on a reticle stage base 60.

A small space may be provided between the reticle stage base 60 and the rectifying plate P8 or between the rectifying plate P8 and the projection optical system 13 in order to prevent vibrations, deformations, or the like generated during the driving of the reticle stage RST from being transmitted to the projection optical system 13 through the reticle stage base 60 and the rectifying plate P8, affecting the imaging performance.

Alternatively, the rectifying plate P8 may be divided into a plurality of parts, and the divided rectifying plates may be provided both on the reticle stage base 60 and the projection optical system 13. In order to block the airflow, the divided rectifying plates may be disposed so as to have a portion in which the divided rectifying plates overlap with each other relative to the airflow direction in a labyrinth structure.

In order to prevent vibrations or deformations from being transmitted, a flexible material may be used for the connection. In such a case, the above space is not necessary.

When the temperature-controlled air flows into the bottom surface of the projection optical system 13, the surface being adjacent to a wafer, a rectifying plate may be provided on a fixed part of the projection optical system 13 or the like.

Aluminum, a stainless steel, or the like may be used as the material of the rectifying plate P8, and the rectifying plate P8 can be sufficiently cleaned by washing without performing any surface treatment. For example, the rectifying plate P8 having a cleanliness of about 0.05 $\mu g/m^3$, which is up to the detection limit in an organic substance degassing measurement by means of gas chromatography, can be used. Also, when a surface treatment is performed or a porous material such as a ceramic is used, the rectifying plate P8 having the equivalent cleanliness may be used.

When a flexible material such as a fluorocarbon resin is used, a treatment, such as a heat treatment, for providing cleanliness may be performed.

Eleventh Embodiment

Figure 28:
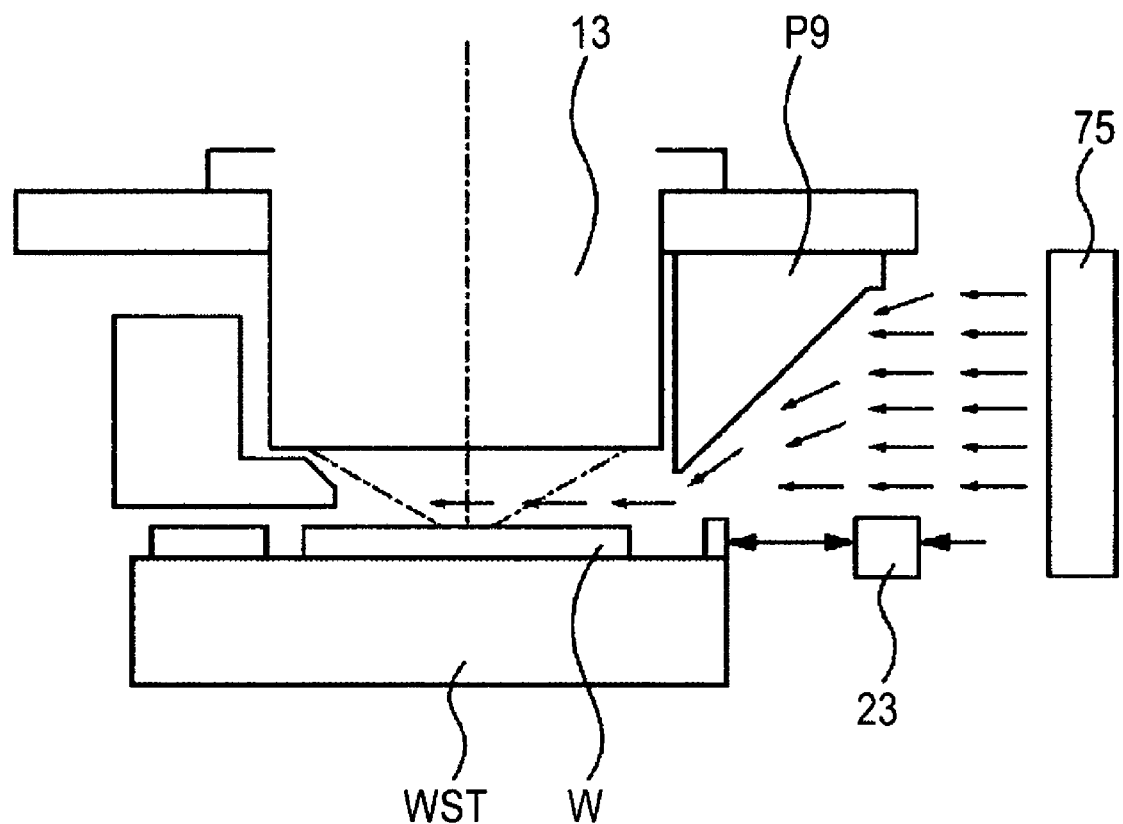
FIG. 28 is a view of an eleventh embodiment of the present invention.

An eleventh embodiment will now be described with reference to FIG. 28. FIG. 28 is an enlarged view of the peripheral part of the wafer stage WST in FIG. 27. In order to maintain the temperature stability of the optical path of an interferometer 23 for detecting the position of the wafer stage WST, temperature-controlled air is supplied from an environmental chamber (not shown in the figure). The temperature-controlled air is supplied from a supply port 75 to a space where the wafer stage WST is disposed. The temperature-controlled air flows to the bottom surface of the projection optical system 13, the surface being adjacent to a wafer. Consequently, a rectifying plate P9 is provided in order to decrease the flow rate of an airflow on the surface of an optical element provided on the bottom surface of the projection optical system 13, the surface being in contact with the outside air, and to decrease the flow volume. By decreasing the flow rate of the airflow on the surface of the optical element provided on the bottom surface of the projection optical system 13, the surface being in contact with the outside air, and decreasing the flow volume, the clouding on the surface of the optical element being in contact with the outside air can be suppressed.

Aluminum, a stainless steel, or the like may be used as the material of the rectifying plate P9, and the rectifying plate P9 can be sufficiently cleaned by washing without performing any surface treatment. For example, the rectifying plate P9 having a cleanliness of about 0.05 $\mu g/m^3$, which is up to the detection limit in an organic substance degassing measurement by means of gas chromatography, can be used. Also, when a surface treatment is performed or a porous material such as a ceramic is used, the rectifying plate P9 having the equivalent cleanliness may be used.

The inside edge of the rectifying plate P9 may be folded towards the wafer to further reduce a flow rate of the gas.

In FIG. 28, the rectifying plate P9 is provided only at the side of the temperature-controlled gas supply port 75 relative to the projection optical system 13. Alternatively, the rectifying plate P9 may be provided to surround the projection optical system 13. It is sufficient that the rectifying plate P9 can decrease the flow rate of the airflow on the surface of the optical element provided on the bottom surface of the projection optical system 13, the surface being in contact with the outside air, and can decrease the flow volume.

The first to eleventh embodiments show examples in which the present invention is applied to an exposure apparatus such as a scanning exposure apparatus or a full plate exposure apparatus, but the present invention is not limited thereto. The present invention provides the same advantages as those described above when applied to any apparatus in which optical elements are used in a similar environment.

In addition, when the optical system is not a projection optical system but a reflective optical system, the present invention can be applied to the optical system, for example, a rectifying plate may be provided around the reflective surface. Thus, the same advantages can be achieved.

According to the embodiments described above, the clouding on the surface of an optical element of an optical apparatus installed in a casing, the surface being in contact with the outside air, can be prevented or at least reduced. Furthermore, when the optical apparatus is applied to an optical apparatus disposed between a light source of an exposure apparatus and a wafer surface, the degradation of exposure illuminance can be suppressed, and thus a device can be stably produced.

In addition, the degradation of the illuminance can be suppressed without forming a completely hermetically sealed structure that includes from the light source of the exposure apparatus to the wafer surface. Therefore, the size of the apparatus is not increased, the consumption flow volume of a gas for purging can be reduced, and the operating cost of the apparatus can be drastically reduced.

Next, as an example of a process for manufacturing a device using the above exposure apparatus, a process for manufacturing a semiconductor device will now be described.

Figure 29:
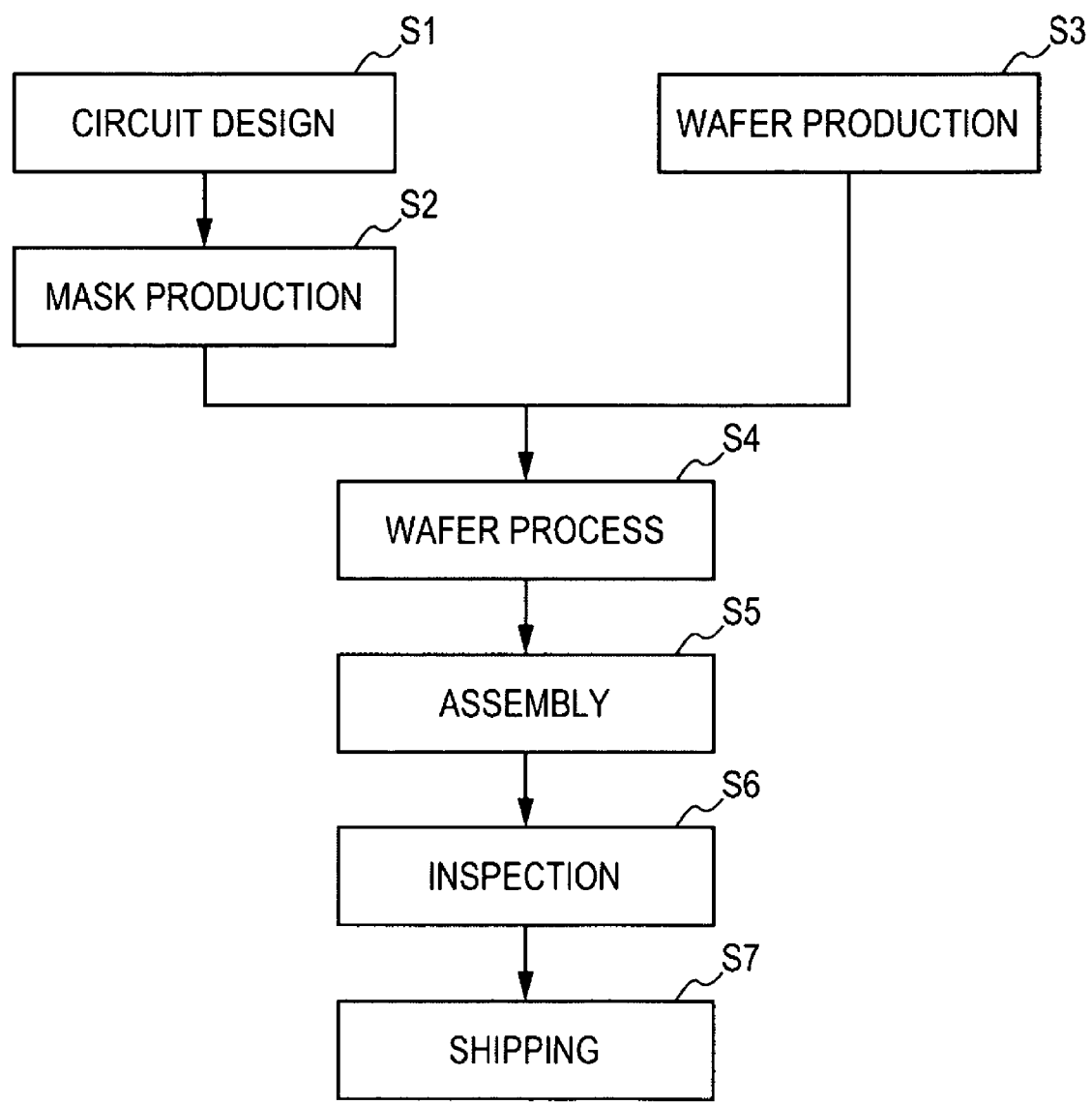
FIG. 29 is a diagram showing a production process of a semiconductor device.

FIG. 29 is a diagram showing a flow of an overall process for manufacturing a semiconductor device. In step 1 (circuit design), a circuit design of the semiconductor device is performed. In step 2 (mask production), a mask is produced on the basis of the designed circuit pattern. On the other hand, in step 3 (wafer production), a wafer is produced using a material such as silicon. In step 4 (wafer process), which is called "a front-end process", circuits are formed on the wafer using the mask by a lithography technology. In step 5 (assembly), which is called "a back-end process", semiconductor chips are produced from the wafer prepared in step 4. Step 5 includes assembling processes such as assembly processes (dicing and bonding) and a packaging process (chip sealing). In step 6 (inspection), inspections such as an operation check test and a durability test of the semiconductor device produced in step 5 are performed. The semiconductor device is completed by these processes and the accomplished semiconductor device is shipped in step 7 (shipping).

Figure 30:
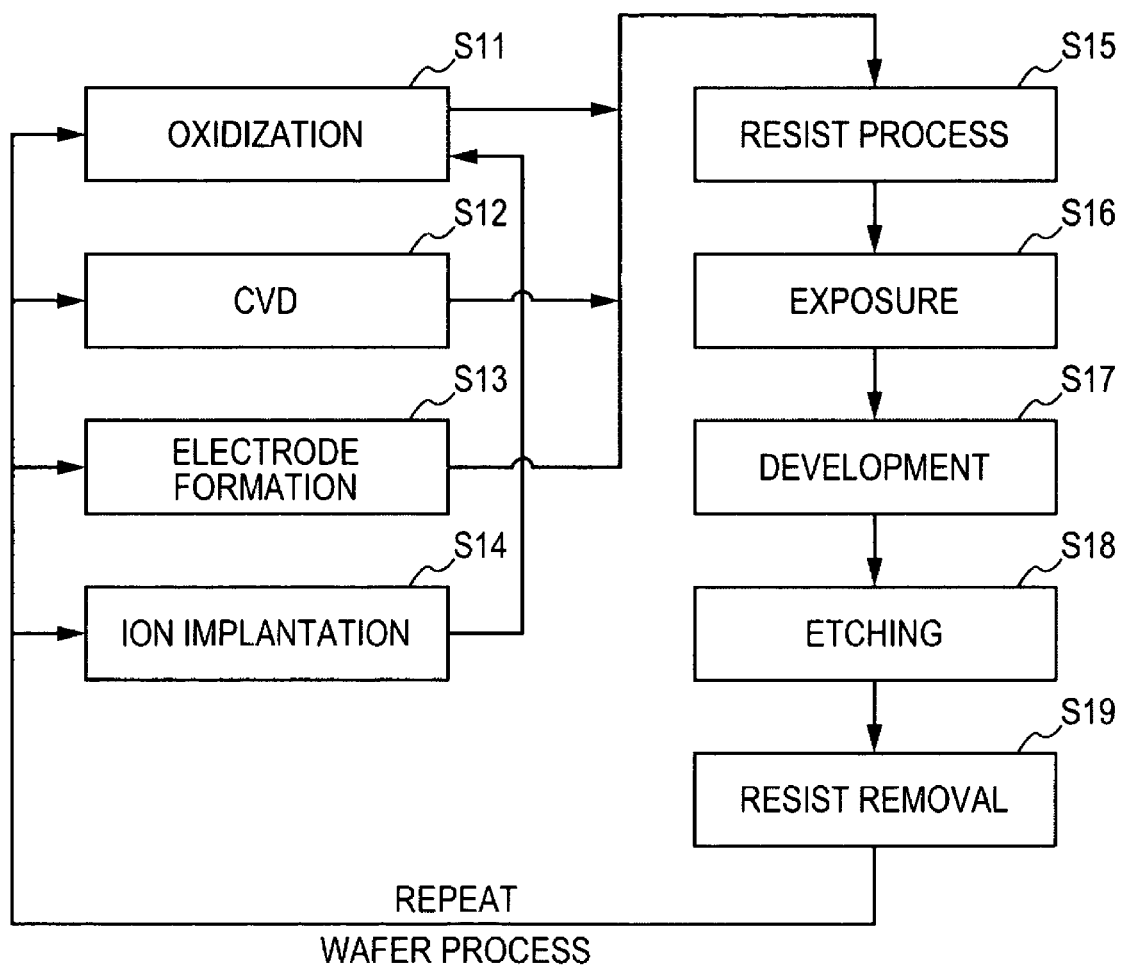
FIG. 30 is a diagram showing a detailed wafer process in FIG. 29.

FIG. 30 is a diagram showing a detailed flow of the above wafer process. In step 11 (oxidization), a surface of the wafer is oxidized. In step 12 (CVD), an insulating film is formed on the surface of the wafer. In step 13 (electrode formation), electrodes are formed on the wafer by vacuum evaporation. In step 14 (ion implantation), an ion is implanted in the wafer. In step 15 (resist process), a photosensitive material, i.e., resist, is applied on the wafer. In step 16 (exposure), a circuit pattern is transferred onto the wafer having the photosensitive material thereon with the above exposure apparatus to form a latent image pattern. In step 17 (development), the latent image pattern formed on the photosensitive material on the wafer is developed. In step 18 (etching), etching is performed using the pattern formed by the development as a mask. In step 19 (resist removal), the resist, which is no longer necessary after the etching, is removed. Multiple circuit patterns are formed on the wafer by repeating these steps.

According to the above embodiments, a novel technique for reducing contamination on the surface of an optical element can be provided.

The present invention is not limited to the above embodiments and various changes and modifications can be made within the scope of the present invention. Therefore, to apprise the public of the scope of the present invention the following claims are made.

This application claims priority from Japanese Application No. 2005-060651, entitled "optical apparatus and method of manufacturing device" and filed on Mar. 4, 2005, the entire contents of which are incorporated herein by reference.

What is claimed is:

1. An exposure apparatus for exposing a substrate to light via an original plate in a chamber in which a gas flow is generated by an atmosphere conditioner, the apparatus comprising:
   an original plate stage configured to hold the original plate;
   a stage base configured to support the original plate stage;
   a projection optical system configured to project a pattern of the original plate onto the substrate, the projection optical system including a plurality of optical elements;
   a holder configured to hold the plurality of optical elements; and
   a cylindrical or conical rectifier provided on the projection optical system side of the stage base and configured to decrease the flow rate of the gas adjacent to the surface of an optical element that is the closest to stage base among the plurality of optical elements.

2. An exposure apparatus for exposing a substrate to light via an original plate in a chamber in which a gas flow is generated by an atmosphere conditioner, the apparatus comprising:
   an original plate stage configured to hold the original plate; and
   a scope provided above the original plate stage and configured to optically detect a mark for aligning the original plate and the substrate, the scope including an optical element;
   a projection optical system configured to project a pattern of the original plate onto the substrate;
   a holder configured to hold the optical element; and
   a rectifier provided on the holder and configured to decrease the gas flow adjacent to the optical element.

* * * * *